US012776383B2

(12) United States Patent
Chen et al.

(10) Patent No.: US 12,776,383 B2
(45) Date of Patent: Oct. 27, 2026

(54) MULTI SENSE TIME VALLEY SEARCH IN NAND

(71) Applicant: Sandisk Technologies, Inc., Milpitas, CA (US)

(72) Inventors: Albert Bor Kai Chen, Milpitas, CA (US); Longju Liu, Fremont, CA (US); Jiahui Yuan, Fremont, CA (US); Anirudh Amarnath, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 172 days.

(21) Appl. No.: 18/808,409

(22) Filed: Aug. 19, 2024

(65) Prior Publication Data

US 2026/0051356 A1 Feb. 19, 2026

(51) Int. Cl.

| | |
|---|---|
| ***G11C 29/12*** | (2006.01) |
| ***G11C 7/06*** | (2006.01) |
| ***G11C 7/22*** | (2006.01) |
| ***G11C 11/407*** | (2006.01) |
| ***G11C 11/4091*** | (2006.01) |
| ***G11C 11/417*** | (2006.01) |
| ***G11C 11/419*** | (2006.01) |

(Continued)

(52) U.S. Cl.

CPC ........ *G11C 29/12005* (2013.01); *G11C 7/065* (2013.01); *G11C 7/22* (2013.01); *G11C 11/407* (2013.01); *G11C 11/4091* (2013.01); *G11C 11/417* (2013.01); *G11C 11/419* (2013.01); *G11C 13/004* (2013.01); *G11C 13/0061* (2013.01); *G11C 16/26* (2013.01); *G11C 16/32* (2013.01); *G11C 29/1201* (2013.01); *G11C 29/12015* (2013.01)

(58) Field of Classification Search

CPC ..... G11C 29/12005; G11C 7/065; G11C 7/22; G11C 11/407; G11C 11/4091; G11C 11/417; G11C 11/419; G11C 13/004; G11C 13/0061; G11C 16/26; G11C 16/32; G11C 29/1201; G11C 29/12015; G11C 29/021; G11C 29/028

See application file for complete search history.

(56) References Cited

U.S. PATENT DOCUMENTS 8,885,416 B2 11/2014 Mui et al.
9,443,606 B2 9/2016 Dutta et al.
(Continued)

OTHER PUBLICATIONS

International Search Report & The Written Opinion of the International Searching Authority dated Aug. 12, 2025, International Application No. PCT/US2025/026527.

*Primary Examiner* — Donald HB Braswell
(74) *Attorney, Agent, or Firm* — Pearl Cohen LLP

(57) ABSTRACT

Technology for multi sense time valley search in NAND memory. The memory cells are sensed multiple times for a single charging of the sense nodes. Also, the voltage to the control gates of the memory cells may be held at the same magnitude for each sensing. Optionally, the control gate voltage may be changed with the memory cells again being sensed multiple times for a single charging of the sense nodes. Each sensing will test for a different Vt in the valley scan. A valley point between two Vt distributions is determined based on the sensing. Substantial time may be saved while still providing for a precise search for the valley point.

16 Claims, 24 Drawing Sheets

(51) Int. Cl.

| | |
|---|---|
| ***G11C 13/00*** | (2006.01) |
| ***G11C 16/26*** | (2006.01) |
| ***G11C 16/32*** | (2006.01) |

(56) References Cited

U.S. PATENT DOCUMENTS

| | | | | |
|---|---|---|---|---|
| 9,472,298 | B1 | 10/2016 | Louie et al. | |
| 9,576,673 | B2 | 2/2017 | Jiang et al. | |
| 10,121,522 | B1 | 11/2018 | Tseng et al. | |
| 10,366,729 | B2 * | 7/2019 | Tseng | G11C 16/0483 |
| 11,430,531 | B2 | 8/2022 | Bazarsky et al. | |
| 12,040,010 | B2 | 7/2024 | Yabe | |
| 2013/0083607 | A1 | 4/2013 | Joo et al. | |
| 2018/0204624 | A1 | 7/2018 | Yoon et al. | |
| 2020/0395082 | A1 | 12/2020 | Vishwanath et al. | |
| 2022/0076738 | A1 * | 3/2022 | Bazarsky | G11C 29/028 |
| 2024/0126453 | A1 * | 4/2024 | Ahn | G06F 3/0619 |
| 2024/0221843 | A1 | 7/2024 | Cho et al. | |
| 2024/0274197 | A1 | 8/2024 | Guo | |
| 2025/0349367 | A1 * | 11/2025 | Li | G11C 16/08 |

* cited by examiner 1202 1204 1206 1208

| Stair Number | DVCG | DVCG_New | DSEN |
|---|---|---|---|
| 1 | - 8 DAC | - 7 DAC | ts1 |
| 2 | - 7 DAC | - 7 DAC | ts1 + ts2 |
| 3 | - 6 DAC | - 7 DAC | ts1+ts2+ts3 |
| 4 | - 5 DAC | - 4 DAC | ts1 |
| 5 | - 4 DAC | - 4 DAC | ts1 + ts2 |
| 6 | - 3 DAC | - 4 DAC | ts1+ts2+ts3 |
| 7 | - 2 DAC | - 1 DAC | ts1 |
| 8 | - 1 DAC | - 1 DAC | ts1 + ts2 |
| 9 | 0 mV | - 1 DAC | ts1+ts2+ts3 |

| Address | | | | | | | | Senses |
|---|---|---|---|---|---|---|---|---|
| | | | | | | 0 | 0 | 1 |
| | | | | | | 0 | 1 | 2 |
| | | | | | | 1 | 0 | 3 |
| | | | | | | 1 | 1 | 4 |

FIG. 16A

| Address | | | | | | | | DSEN |
|---|---|---|---|---|---|---|---|---|
| | | | | | | 0 | 0 | 0 |
| | | | | | | 0 | 1 | x ns |
| | | | | | | 1 | 0 | 1.5x ns |
| | | | | | | 1 | 1 | 2x ns |

FIG. 16B

MULTI SENSE TIME VALLEY SEARCH IN NAND

BACKGROUND

The present disclosure relates to technology for non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. Herein, a memory system that uses non-volatile memory for storage may be referred to as a storage system. The memory structure may be three-dimensional (3D). One type of 3D structure has non-volatile memory cells arranged as vertical NAND strings. The 3D memory structure may be arranged into units that are commonly referred to as blocks. For example, a block in a NAND memory system contains many NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the physical block.

One type of three-dimensional memory structure has alternating dielectric layers and conductive layers in a stack. NAND strings are formed vertically in the alternating dielectric layers and conductive layers in what may be referred to as memory holes. For example, after memory holes are drilled into the stack of alternating dielectric layers and conductive layers, the memory holes are filled in with layers of materials to create a vertical column of memory cells (e.g., NAND string). These layers may include one or more layers for a tunnel dielectric, a charge-trapping material, and a channel (or body).

For memory such as NAND, a large set of memory cells are erased prior to programming. After erasing, the memory cells are programmed one unit at a time. In some techniques, the memory cells are programmed one word line at a time. The non-volatile memory cells may be programmed to store data. Typically, the memory cells are programmed to a number of data states. Using two data states to store a single bit per cell is referred to herein as SLC programming. Using a greater number of data states allows for more bits to be stored per memory cell. Using additional data states to store two or more bits per cell is referred to herein as MLC programming. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell. Each data state may be associated with a unique Vt distribution.

Once the memory cells in the memory device have been programmed, data may be read from the memory cells by sensing the programmed states of the memory cells. In one technique, the memory cells are sensed at one or more "read reference voltages." A read reference voltage is used to distinguish between two of the states. However, sensed states can sometimes vary from the written states due to one or more factors. One factor is that the amount of charge stored in the memory cells may change over time thereby changing the Vt of the memory cells. Hence, the Vt distributions may move over time.

FIG. 1A is graph of threshold voltage (Vt) versus number of memory cells, and illustrates example Vt distributions 10, 20. These Vt distributions 10, 20 could be any two such as two of the eight Vt distributions used when programming three bits per cell or two of the 16 Vt distributions used when programming four bits per cell. The valley point between the two Vt distributions 10, 20 may be used as a read level to distinguish between the two Vt distributions 10, 20. However, over time the Vt distributions 10, 20 may shift either down or up due to changes in memory cell Vt. Therefore, the location of the valley point could move up or down. Although some errors can be corrected with an ECC algorithm, reading the memory cells using a read reference level too far from the valley point results in an unacceptable error rate.

One technique to reduce the bit error rate is to perform a valley scan to look for the valley point. Then, the memory cells are read using a read reference level at the valley point. However, such valley scan can be time consuming. FIG. 1A shows an example in which the memory cells are read at nine different reference voltages to seek the valley point. FIG. 1B is a diagram showing a few details of a conventional valley scan. This example valley scan is divided into an ER search and an AR search. The ER search scans for the valley point between an E-state and an F-state (see FIG. 5B), whereas the AR search scans for the valley point between an Er-state and an A-state (see FIG. 5B). During the ER search the memory system applies a sequence of voltages 30 to the selected word line (WLsel). The selected word line refers to the word line that is connected to the memory cells to be read. In this example, the word line voltage has nine different magnitudes during the ER search, corresponding to the nine read levels in FIG. 1A. Moreover, the memory system will sense the memory cells nine times during the ER search as indicated by the "sense" signals 40. In a conventional ER search each sense operation can take a substantial amount of time due to, for example, needing to charge a sense node for each of the nine sense operations. The AR search in this example is similar to the ER search, with nine different voltages 32 applied to the selected word line and nine sense operations 42. Based on results of scanning for the two valley points, the memory system re-calibrates the read reference levels. Then a calibrated read is performed in which the calibrated read voltages (Er_cal, AR_cal) are applied to the selected word line. The memory cells are sensed 44 while applying ER_cal and sensed 46 while applying AR_cal to the selected word line. Note that the calibrated read might be used to read one page of data, with additional valley scans needed for reading other pages of data stored in the memory cells.

The examples in FIGS. 1A and 1B illustrate that it can be quite time consuming to perform the valley scans. An additional issue is that if the Vt distributions shift too far, the valley scan could miss the valley point. FIG. 1C shows the two Vt distributions 10, 20 having shifted such that the conventional valley scan misses the valley point. Note that the Vt distributions 10, 20 could shift either up or down. To avoid missing the valley point a greater number of reads could be performed, as depicted in FIG. 1D. However, performing greater number of reads increases the time needed for the valley scan. Another possibility is to increase the voltage gap between the reads. FIG. 1E shows nine possible read levels that are more widely spaced than in FIGS. 1C and 1D. However, the wider spacing in the read levels reduces the accuracy of the identification of the valley point.

BRIEF DESCRIPTION OF THE DRAWINGS

Like-numbered elements refer to common components in the different figures.

FIG. 16A is a table that may be used to specify how many senses should be performed per a single charge of the sense node during a valley scan.

FIG. 16B is a table that may be used to specify the individual sense times.

DETAILED DESCRIPTION

Technology is disclosed for multi sense time valley search in NAND memory. The memory cells are sensed multiple times for a single charging of the sense nodes. Also, the voltage to the control gates of the memory cells may be held at the same magnitude for each of these multiple sensings. Optionally, the control gate voltage may be changed with the memory cells again being sensed multiple times for a single charging of the sense nodes. Each sensing will test for a different Vt in the valley scan. A valley point between two Vt distributions is determined based on the sensing. Substantial time may be saved while still providing for a precise search for the valley point.

Figure 1A:
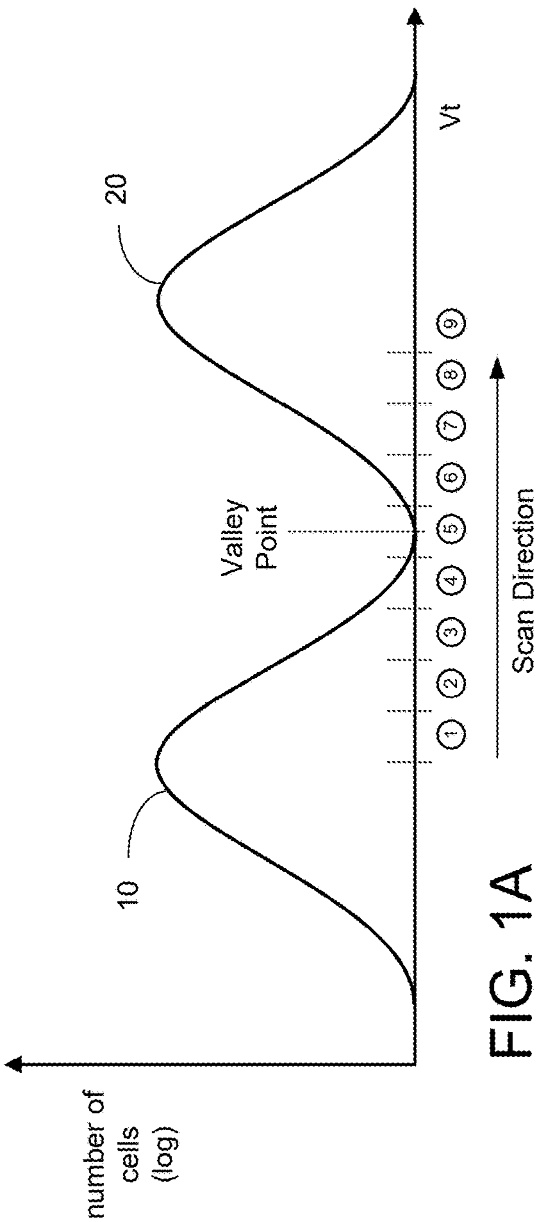
FIG. 1A is graph of threshold voltage (Vt) versus number of memory cells.
Figure 1B:
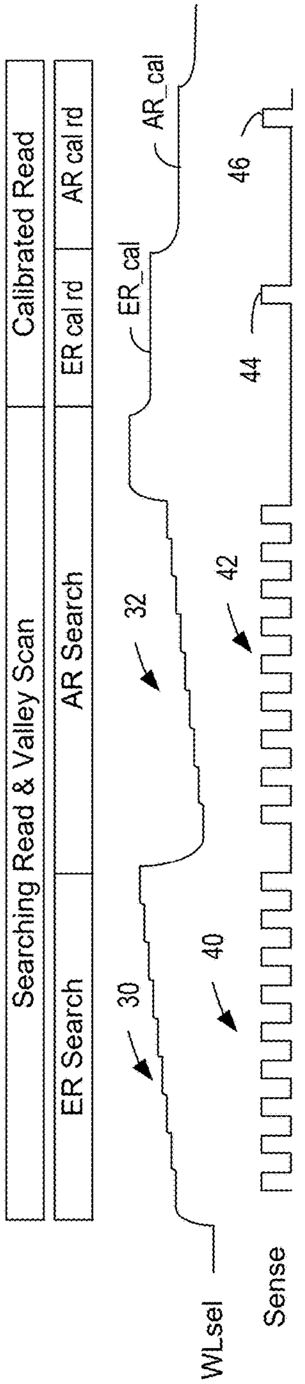
FIG. 1B (Conventional Art)
FIG. 1B is a diagram showing a few details of a conventional valley scan.
Figure 1C:
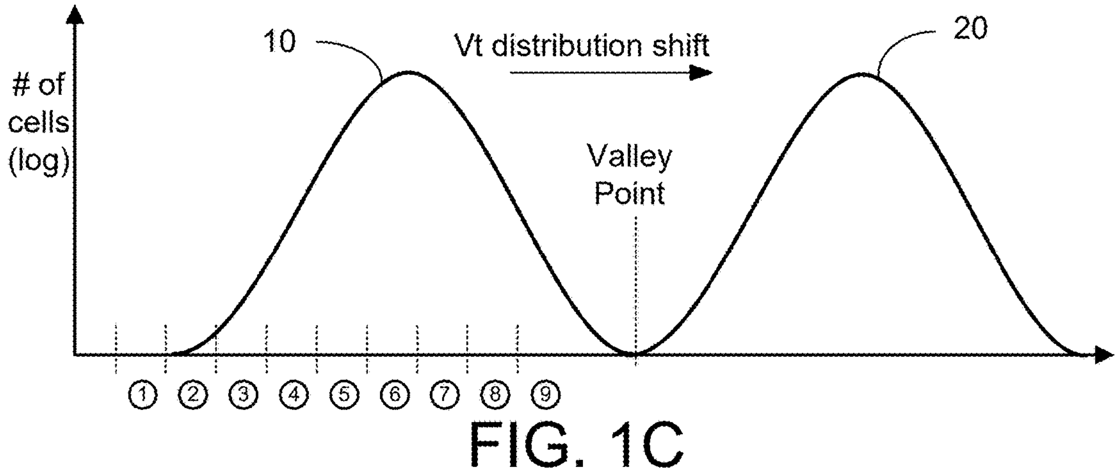
FIG. 1C shows the two Vt distributions having shifted such that the conventional valley scan misses the valley point.
Figure 1D:
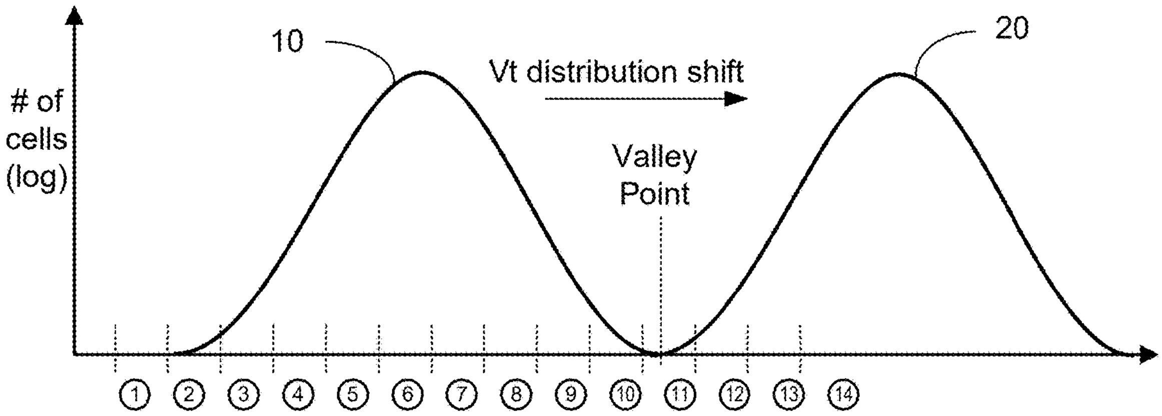
FIG. 1D shows the two Vt distributions with additional steps in the conventional valley scan to be able to catch the valley point.
Figure 1E:
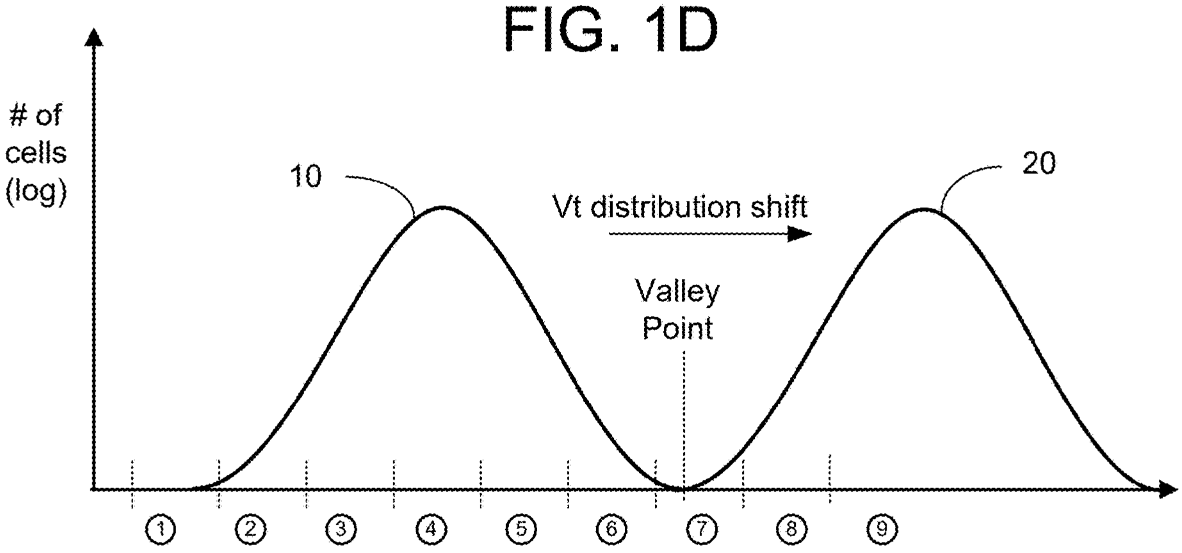
FIG. 1E shows the two Vt distributions with wider steps in the conventional valley scan to be able to catch the valley point.
Figure 2A:
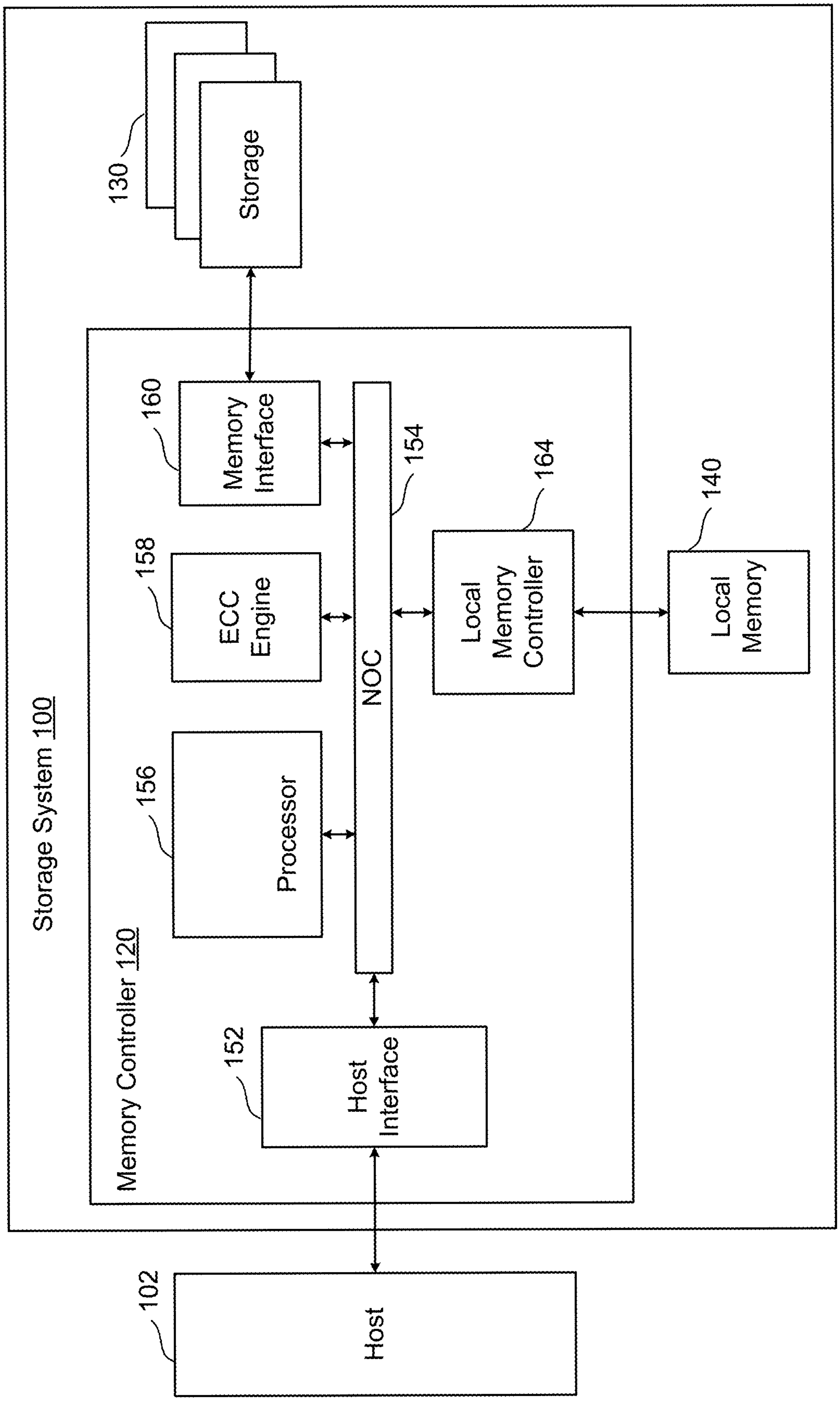
FIG. 2A is a block diagram depicting one embodiment of a memory system.

FIG. 2A is a block diagram of one embodiment of a memory system 100 that implements the technology described herein. In one embodiment, memory system 100 is a solid state drive ("SSD"). Memory system 100 can also be a memory card, USB drive or other type of memory system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 2A are electrical circuits. Memory system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit.

NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations such as programming, erasing, reading, and memory management processes. In one embodiment, processor 156 is programmed by firmware. In other embodiments, processor 156 is a custom and dedicated hardware circuit without any software. Processor 156 may also implement a translation module, as a software/firmware process or as a dedicated hardware circuit. In many systems, the non-volatile memory is addressed internally to the memory system using physical addresses associated with the one or more memory die. However, the host system will use logical addresses to address the various memory locations. This enables the host to assign data to consecutive logical addresses, while the memory system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a memory system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2B:
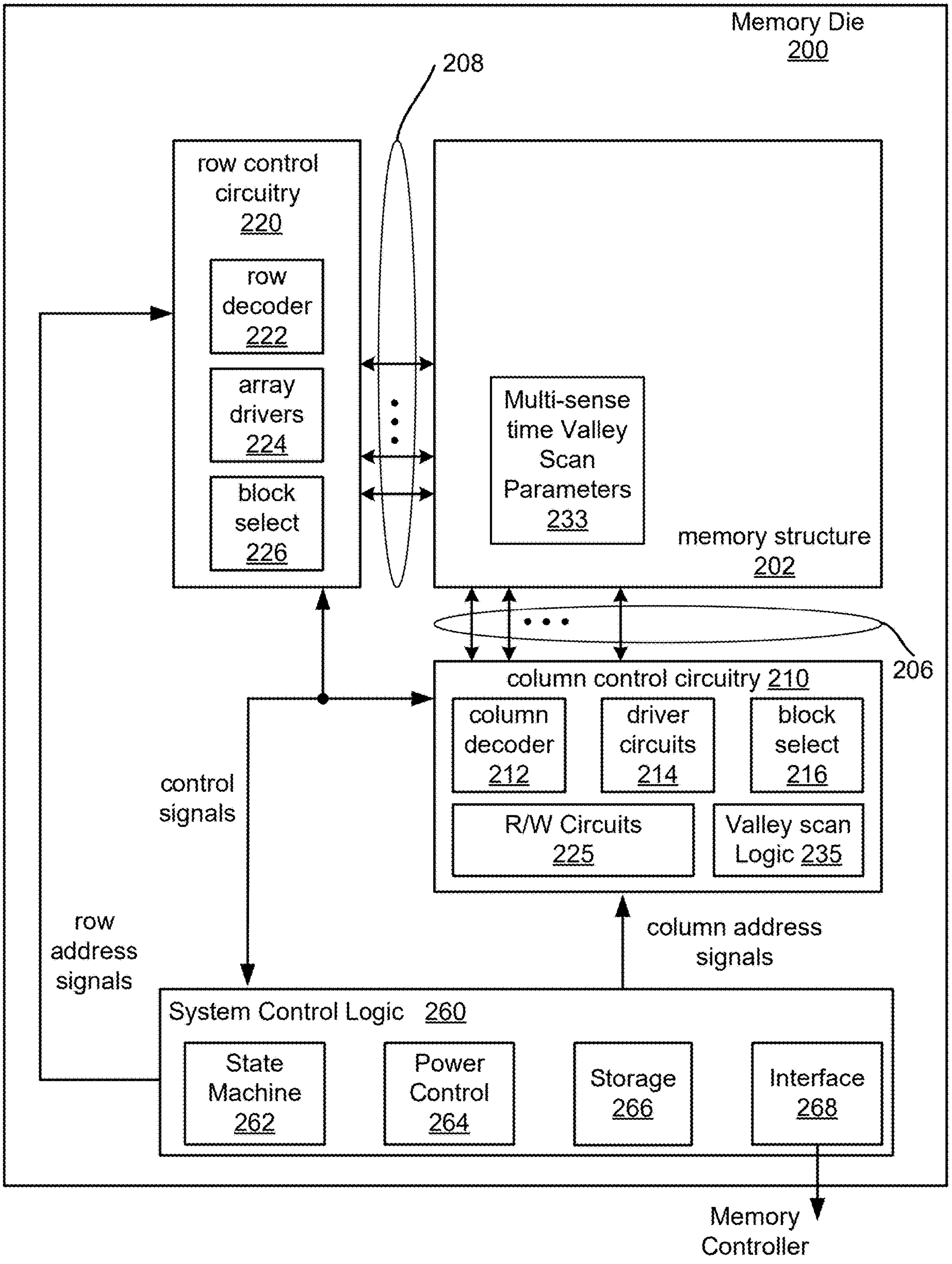
FIG. 2B is a block diagram of one embodiment of a memory die.

In one embodiment, non-volatile storage 130 comprises one or more memory dies. FIG. 2B is a functional block diagram of one embodiment of a memory die 200 that comprises non-volatile storage 130. Each of the one or more memory dies of non-volatile storage 130 can be implemented as memory die 200 of FIG. 2B. The components depicted in FIG. 2B are electrical circuits. Memory die 200 includes a memory structure 202 (e.g., memory array) that can comprise non-volatile memory cells (also referred to as non-volatile storage cells), as described in more detail below.

The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers. The system control logic 260, column control circuitry 210, and/or row control circuity 220 are configured to control memory operations such as open block reads at the die level.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

The memory structure 202 may store multi-sense time valley scan parameters 233. The multi-sense time valley scan parameters 233 may be used to facilitate reducing the number of times that sense nodes in the R/W circuits 225 are charged during the valley scan for a valley point between two Vt distributions. In an embodiment, the valley scan logic 235 is used to locate the valley point between two Vt distributions. The valley point may be determined based on a "mis-compares," between two successive sense operations. Each sense operation corresponds to a test for a different Vt in the valley scan. The R/W circuits 225 has data latches, which may be used to store results from sensing the memory cells. These data latches can be updated with each sense operation in the valley scan. In an embodiment, the valley scan logic 235 counts the number of data latches that change their state between two successive sense operations in the valley scan ("mis-compares"). The valley scan logic 235 may note the point at which these mis-compares reach the minimum. The valley is at, or near, the two tested Vts that correspond to the result with the minimum mis-compares.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2B can be grouped into two parts: (1) memory structure 202 and (2) peripheral circuitry, which includes all of the other components depicted in FIG. 2B. An important characteristic of a memory circuit is its capacity, which can be increased by increasing the area of the memory die of memory system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the memory system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2B onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2C:
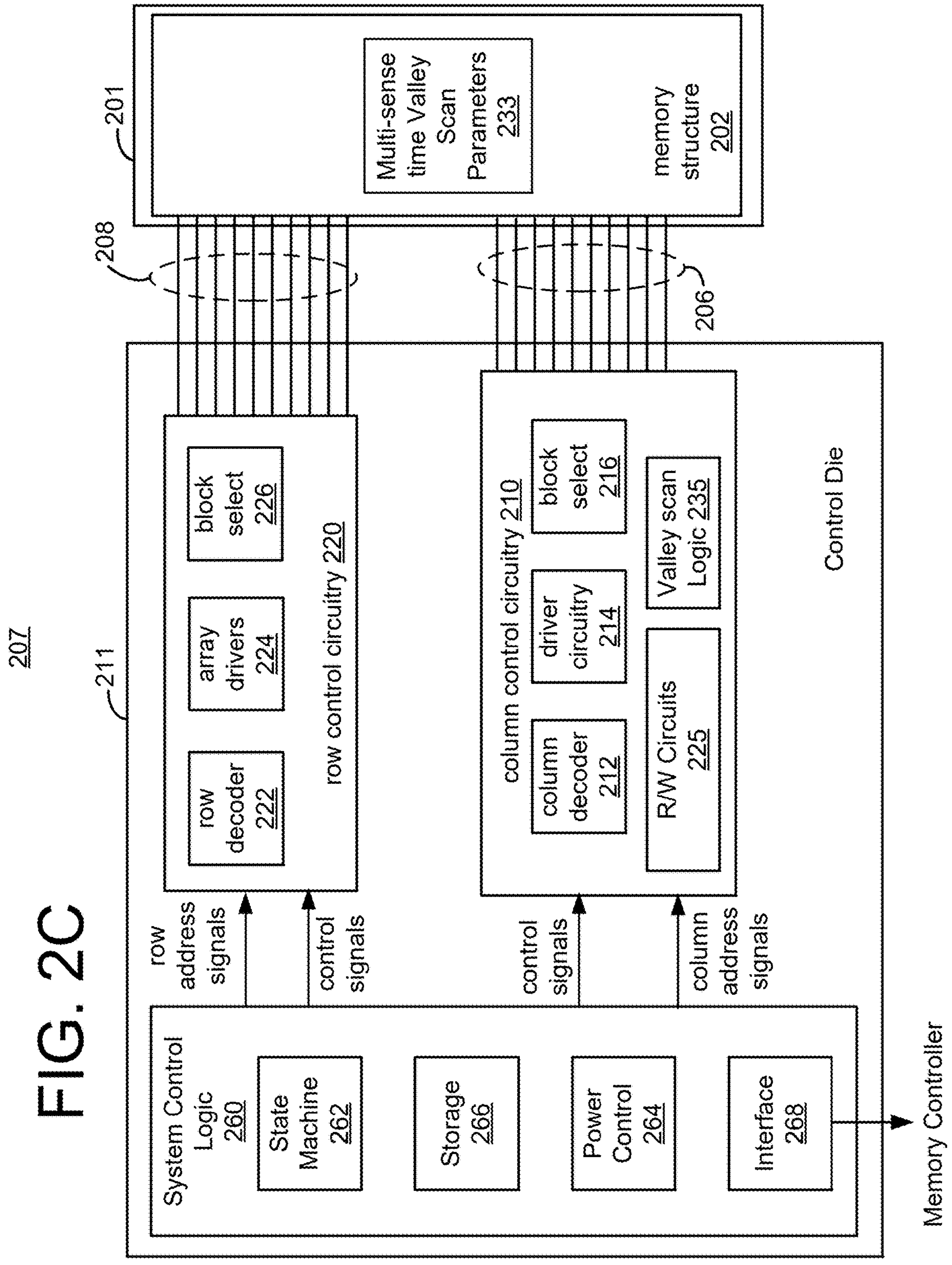
FIG. 2C is a block diagram of one embodiment of an integrated memory assembly.

FIG. 2C shows an alternative arrangement to that of FIG. 2B which may be implemented using wafer-to-wafer bonding to provide a bonded die pair. FIG. 2C depicts a functional block diagram of one embodiment of an integrated memory assembly 207. One or more integrated memory assemblies 207 may be used to implement the non-volatile storage 130 of memory system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2C shows an example of the peripheral circuitry, including control circuits, formed in a peripheral circuit or control die 211 coupled to memory structure 202 formed in memory structure die 201. Common components are labelled similarly to FIG. 2B. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2C shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, memory system 100, storage 130, memory die 200, integrated memory assembly 207, and/or control die 211.

Figure 3A:
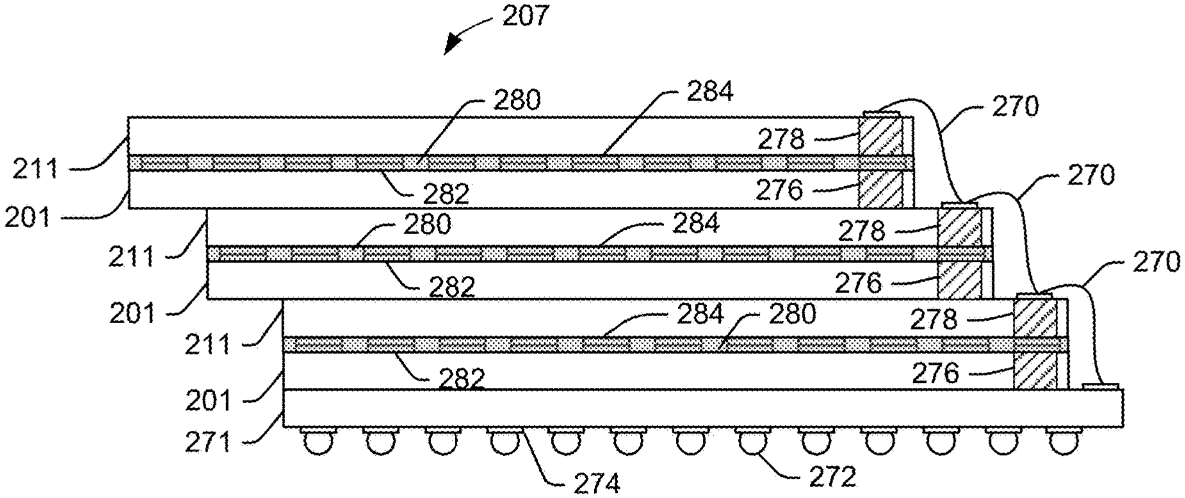
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
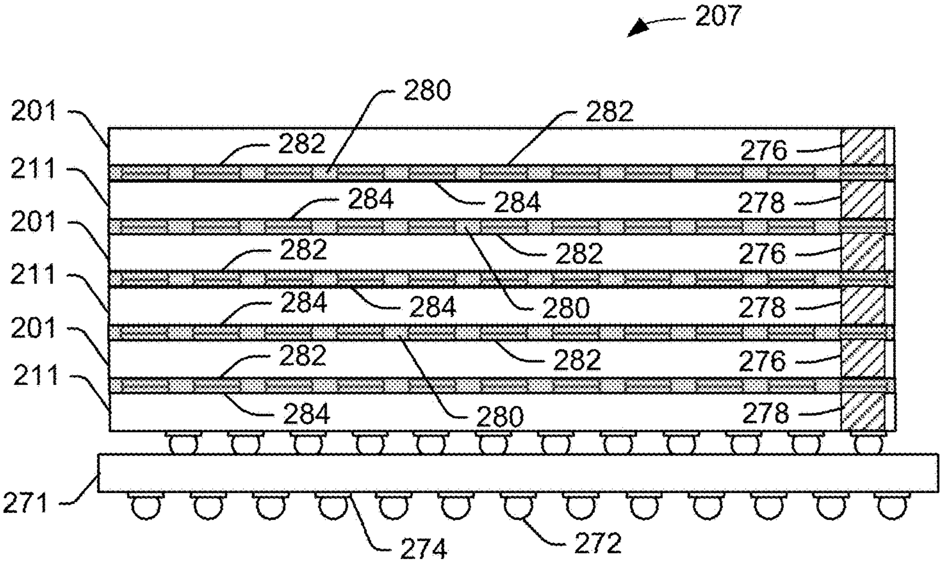

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 3C:
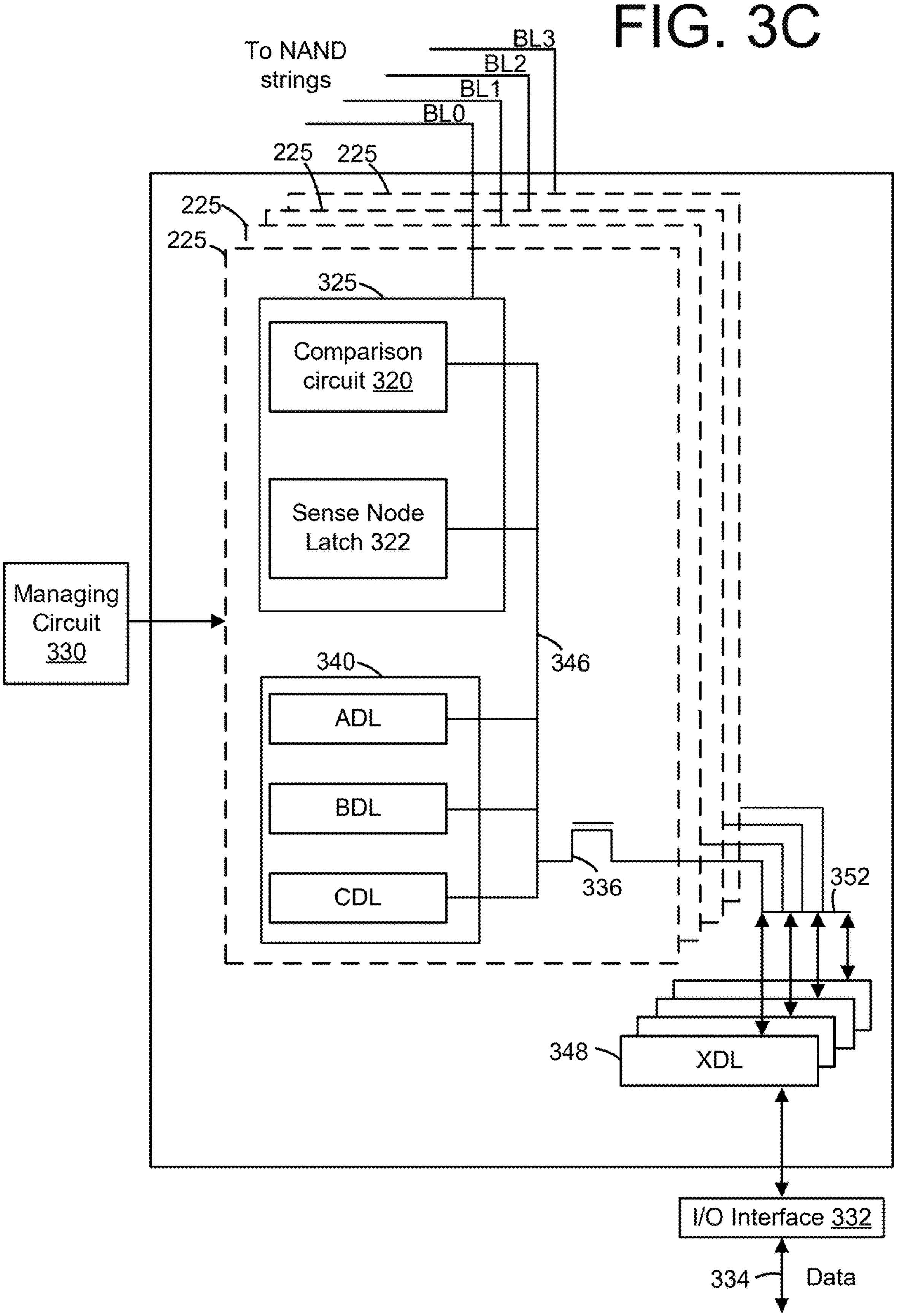
FIG. 3C is a block diagram depicting one embodiment of a portion of column control circuitry that contains a number of read/write circuits.

FIG. 3C is a block diagram depicting one embodiment of a portion of column control circuitry 210 that contains a number of read/write circuits 225. Each read/write circuit 225 is partitioned into a sense amplifier 325 and data latches 340. A managing circuit 330 controls the read/write circuits 225. The managing circuit 330 may communicate with state machine 262. In one embodiment, each sense amplifier 325 is connected to a respective bit line. Each bit line may be connected, at one point in time, to one of a large number of different NAND strings. A select gate on the NAND string may be used to connect the NAND string channel to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier. The following will discuss use of the sense amplifier 325 to sense a condition (e.g., data state) of a memory cell.

Each sense amplifier 325 may have a sense node. During sensing, a sense node is charged up to an initial voltage, Vsense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time.

In particular, the comparison circuit 320 determines the amount of decay by comparing the sense node voltage to a trip voltage after the sensing time. If the sense node voltage decays below the trip voltage, Vtrip, the memory cell is in a conductive state and its Vth is at or below a reference voltage. If the sense node voltage does not decay below Vtrip, the memory cell is in a non-conductive state and its Vth is above a reference voltage. A sense node latch 322 is set to 0 or 1, for example, by the comparison circuit 320 based on whether the memory cell is in a conductive or non-conductive state, respectively. The bit in the sense node latch 322 can also be used in a lockout scan to decide whether to set a bit line voltage to an inhibit or a program enable level in a next program loop. The bit in the sense node latch 322 can also be used in a lockout mode to decide whether to set a bit line voltage to a sense voltage or a lockout voltage in a read operation.

In an embodiment of a valley scan, the memory cell is sensed multiple times per one charging of the sense node. As described above, the sense node is charged up to an initial voltage, Vsense_init, such as 3V. The sense node is then connected to the bit line for a first sensing time, and an amount of decay of the sense node is used to determine whether a memory cell is in a conductive or non-conductive state. Note that the sense node may be disconnected from the bit line after the first sense time. The amount of decay may be measured by sensing the voltage on the sense node after the first sense time. Then, without again charging up the sense node to the initial voltage the sense node is then connected to the bit line for a second sensing time. After disconnecting the sense node from the bit line the further amount of decay may be measured by sensing the voltage on the sense node after the second sense time. This process may be repeated for third or oven more sense times. Each sense time tests the memory cell for a different Vt, which saves considerable time during an embodiment of a valley scan.

The data latches 340 are coupled to the sense amplifier 325 by a local data bus 346. The data latches 340 include three latches (ADL, BDL, CDL) for each sense amplifier 325 in this example. More or fewer than three latches may be included in the data latches 340. In one embodiment, for programming each data latch 340 is used to store one bit to be stored into a memory cell and for reading each data latch 340 is used to store one bit read from a memory cell. In a three bit per memory cell embodiment, ADL stores a bit for a lower page of data, BDL stores a bit for a middle page of data, CDL stores a bit for an upper page of data. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340.

During program or verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a verify operation to determine if the memory cells have been programmed to the desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate.

Figure 4:
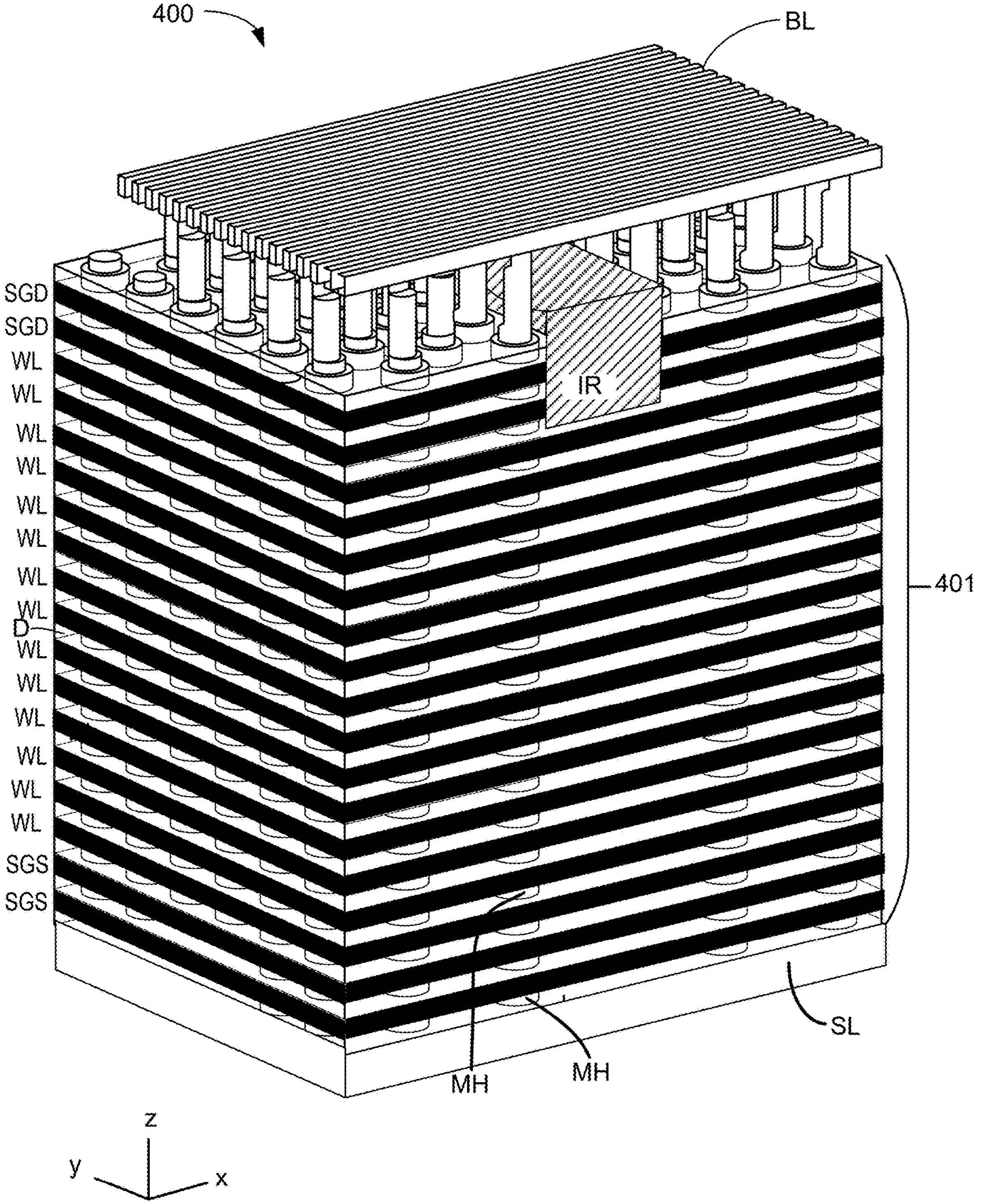
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D. The conductive layers are labeled as one of: SGD, WL, or SGS. An SGD conductive layer serves as drain side select lines. A WL conductive layer serves as a word line. An SGS conductive layer serves as a source side select line. The numbers of each of these conductive layers is limited for ease of illustration. The number of alternating dielectric layers and conductive layers can vary based on specific implementation requirements. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

In one embodiment the block is operated as a number of "sub-blocks." Each of these "sub-blocks" has many NAND strings. In an embodiment, an isolation region (IR) divides the SGD layers into multiple SGD select lines, each of which is used to select a sub-block (e.g., set of NAND strings). FIG. 4 depicts an example having one IR region and thereby two sub-blocks. However, there may be more than one IR region and thereby more than two sub-blocks. Optionally, the IR region can extend downward through all of the alternating dielectric layers and conductive layers.

Figure 4A:
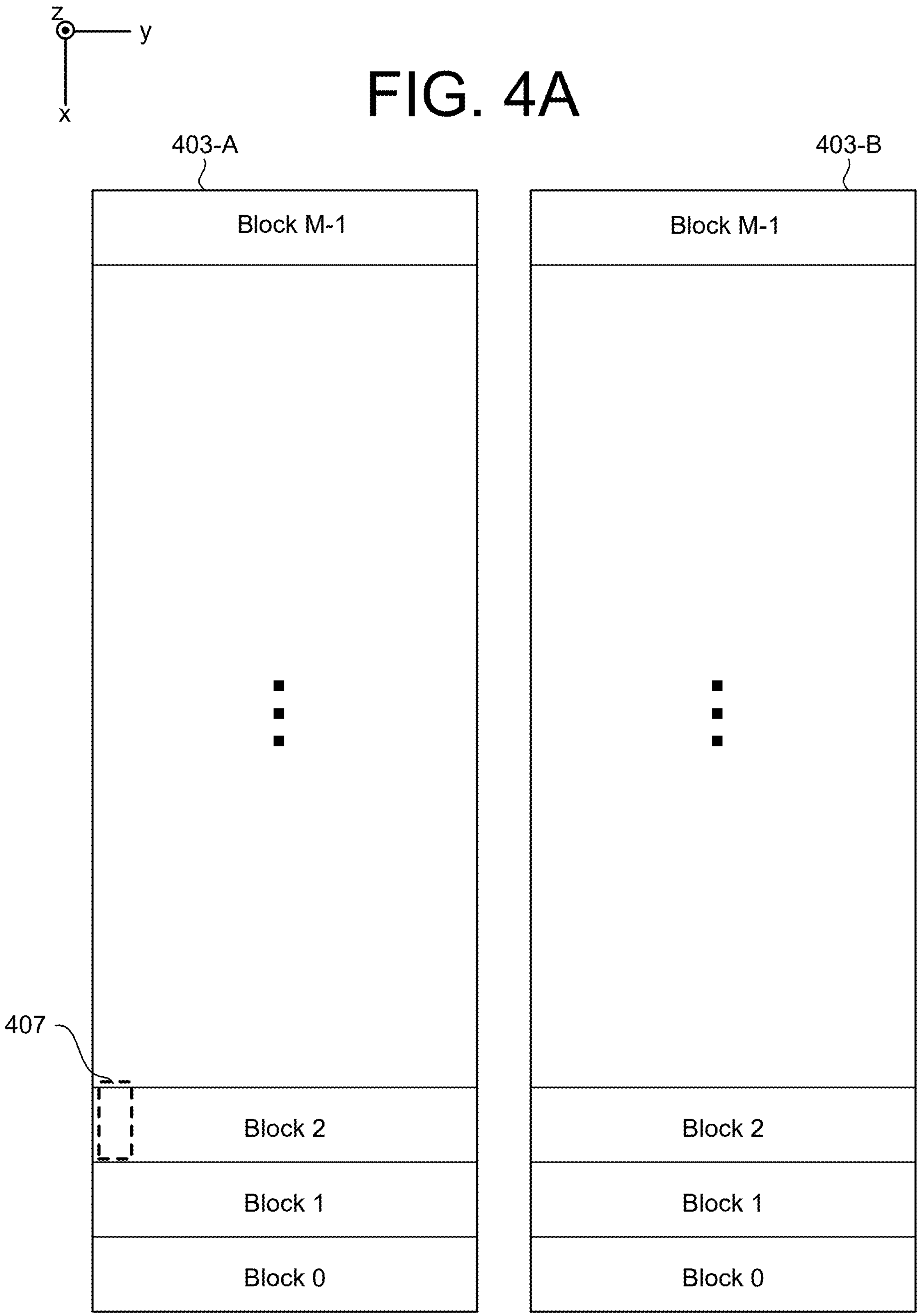
FIG. 4A is a block diagram of one embodiment of a memory structure having two planes.

FIG. 4A is a block diagram explaining one example organization of memory structure 202, which is divided into two planes 403-A and 403-B. Each plane 403 is then divided into M physical blocks. In one example, each plane has about 2000 physical blocks (or more briefly "blocks"). However, different numbers of blocks and planes can also be used. In one "full-block" embodiment, a block of memory cells is a unit of erase. That is, all memory cells of a block are erased together. In a "sub-block mode" embodiment, blocks are divided into sub-blocks and the sub-blocks are the unit of erase. In an embodiment, a block contains a number of word lines with each sub-block containing a unique set of the data word lines. In an embodiment, each plane 403-A, 403-B has a set of bit lines that extend across all of the blocks in that plane. In an embodiment, one block per plane is selected at a time. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 403-A, 403-B more or fewer than two planes can be implemented. In some embodiments, memory structure 202 includes four planes. In some embodiments, memory structure 202 includes eight planes. In some embodiments, programming can be performed in parallel in a first selected block in plane 403-A and a second selected block in plane 403-B.

Figure 4B:
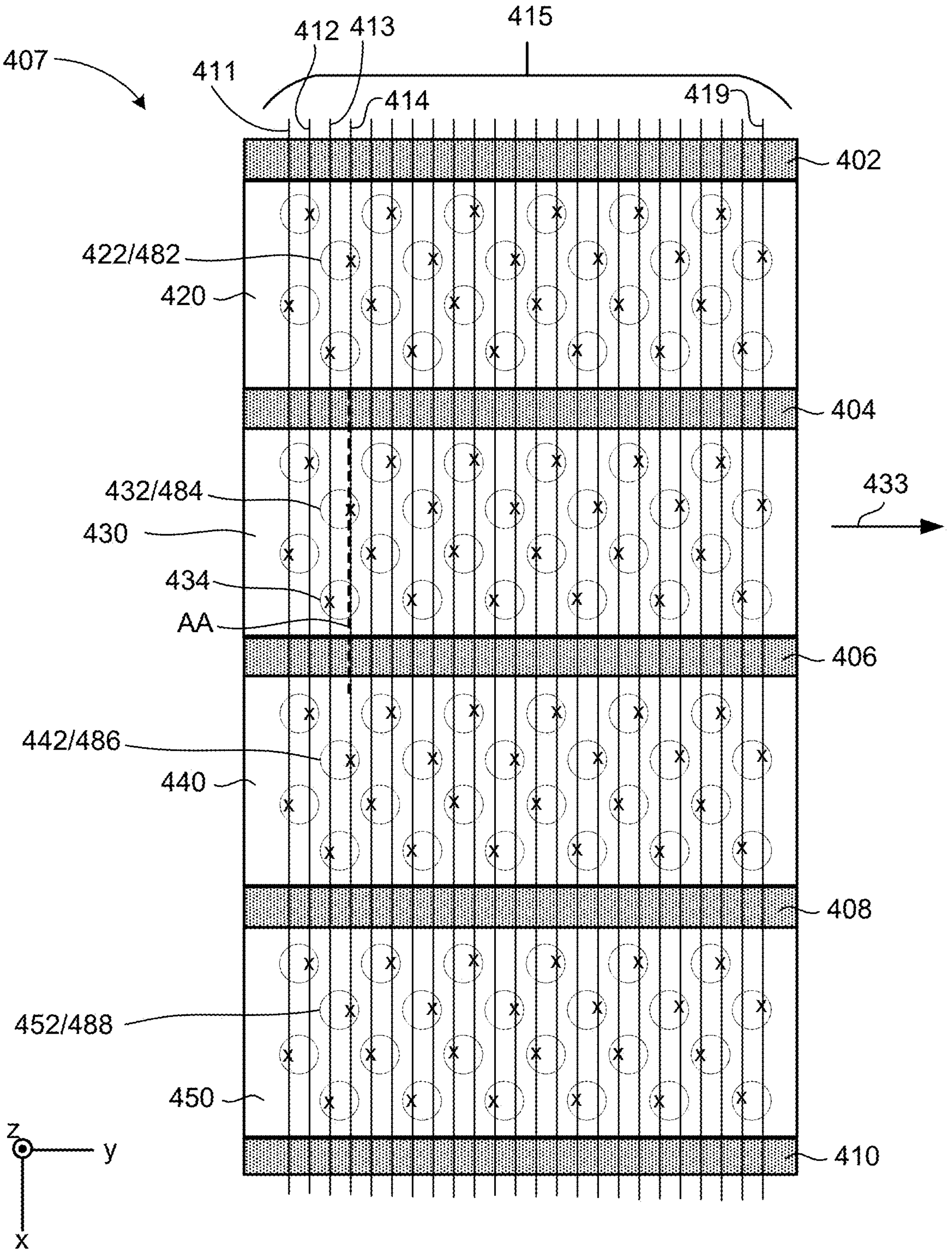
FIG. 4B is a block diagram depicting a top view of a portion of block of memory cells showing an array region.

FIGS. 4B-4E depict an example three dimensional ("3D") NAND structure that corresponds to the structure of FIG. 4 and can be used to implement memory structure 202 of FIGS. 2A and 2B. FIG. 4B is a diagram depicting a top view of a portion 407 of Block 2. As can be seen from FIG. 4B, the physical block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, and 452. Vertical column 422 implements NAND string 482. Vertical column 432 implements NAND string 484. Vertical column 442 implements NAND string 486. Vertical column 452 implements NAND string 488. More details of the vertical columns are provided below. Since the physical block depicted in FIG. 4B extends in the direction of arrow 433, the physical block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the physical block is depicted. It is contemplated that more than twenty-four bit lines connected to vertical columns of the physical block. Each of the circles representing vertical columns has an "x" to indicate its connection to one bit line. For example, bit line 414 is connected to vertical columns 422, 432, 442 and 452.

The physical block depicted in FIG. 4B includes a set of isolation regions 402, 404, 406, 408, and 410, which are formed of $SiO_2$; however, other dielectric materials can also be used. Isolation regions 402, 404, 406, 408, and 410 serve to divide the top layers of the physical block into four regions; for example, the top layer depicted in FIG. 4B is divided into regions 420, 430, 440, and 450, which are referred to herein as "sub-blocks. Each sub-block contains a large number of NAND strings. In one embodiment, isolation regions 402 and 410 separate the physical block 407 from adjacent physical blocks. Thus, isolation regions 402 and 410 may extend down to the substrate. In one embodiment, the isolation regions 404, 406, and 408 only divide the layers used to implement select gates so that NAND strings in different sub-blocks can be independently selected. Referring back to FIG. 4, the IR region may correspond to any of isolation regions 404, 406, or 408. In one example implementation, a bit line only connects to one vertical column/NAND string in each of regions (sub-blocks) 420, 430, 440, and 450. In that implementation, each physical block has sixteen rows of active columns and each bit line connects to four NAND strings in each block. In one embodiment, all of the four vertical columns/NAND strings connected to a common bit line are connected to the same word line (or set of word lines); therefore, the system uses the drain side selection lines to choose one (or another subset) of the four to be subjected to a memory operation (program, verify, read, and/or erase).

Although FIG. 4B shows each region (420, 430, 440, 450) having four rows of vertical columns, four regions (420, 430, 440, 450) and sixteen rows of vertical columns in a block, those exact numbers are an example implementation. Other embodiments may include more or fewer regions (420, 430, 440, 450) per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
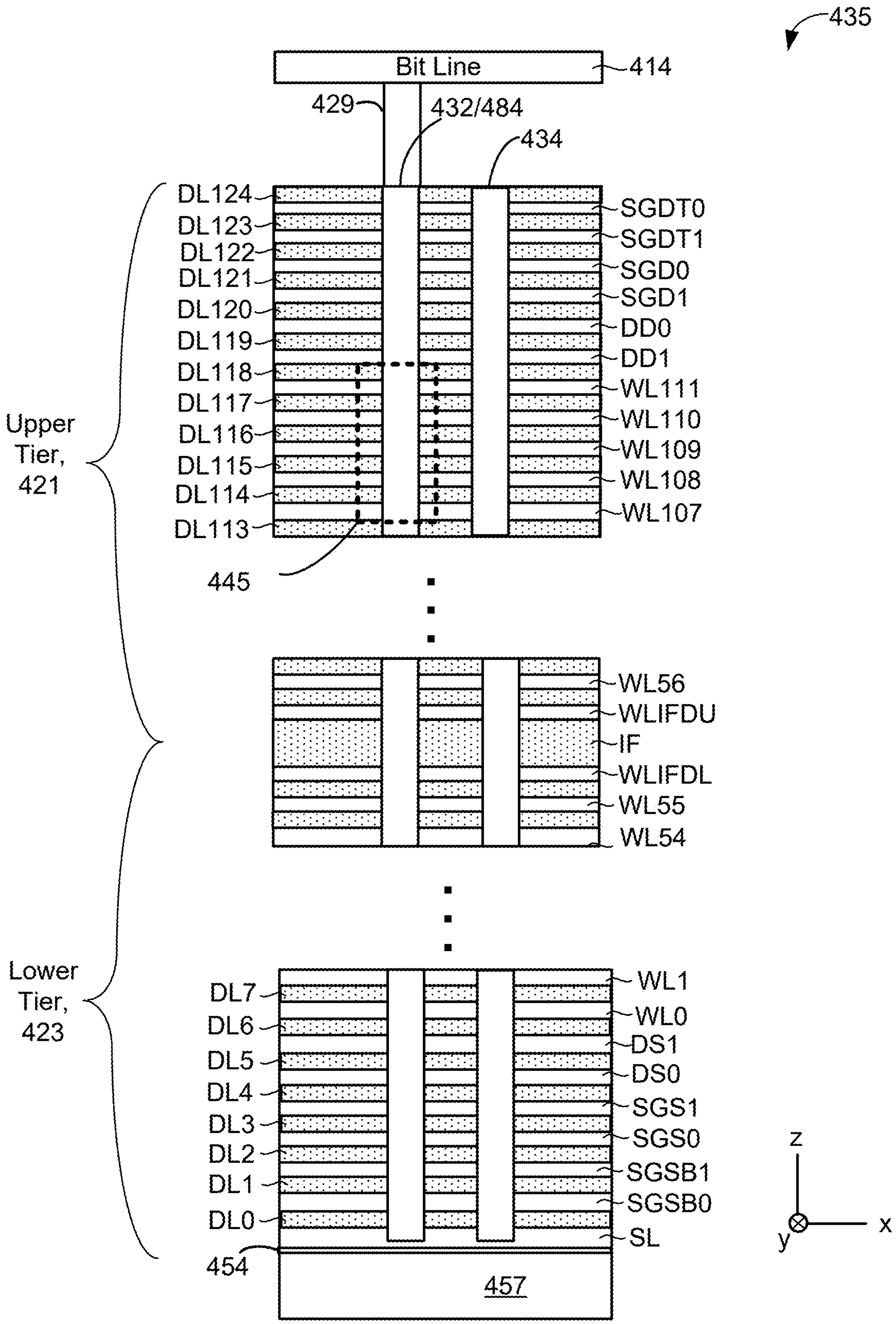
FIG. 4C depicts an example of a stack showing a cross-sectional view along line AA of FIG. 4B.

FIG. 4C depicts an example of a stack 435 showing a cross-sectional view along line AA of FIG. 4B. The SGD layers include SGDT0, SGDT1, SGD0, and SGD1. The SGD layers may have more or fewer than four layers. The SGS layers includes SGSB0, SGSB1, SGS0, and SGS1. The SGS layers may have more or fewer than four layers. Six dummy word line layers DD0, DD1, WLIFDU, WLIDDL, DS1, and DS0 are provided, in addition to the data word line layers WL0-WL111. There may be more or fewer than 112 data word line layers and more or fewer than six dummy word line layers. Each NAND string has a drain side select gate at the SGD layers. Each NAND string has a source side select gate at the SGS layers. Also depicted are dielectric layers DL0-DL124.

Columns 432, 434 of memory cells are depicted in the multi-layer stack. The stack includes a substrate 457, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 429 connects the drain-end of NAND string 484 to the bit line 414.

In one embodiment, the memory cells are arranged in NAND strings. The word line layers WL0-WL111 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have the same structure. Drain side select layers SGD are used to electrically connect and disconnect (or cut off) the channels of respective NAND strings from bit lines. Source side select layers SGS are used to electrically connect and disconnect (or cut off) the channels of respective NAND strings from the source line SL.

FIG. 4C depicts an example of a stack 435 having two tiers (lower tier 423, upper tier 421). A two tier or other multi-tier stack can be used to form a relatively tall stack while maintaining a relatively narrow memory hole width (or diameter). After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole were etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines (WLIFDL, WLIFDU). In some embodiments, the tiers are erased independent of one another. Hence, data may be maintained in the upper tier 421 after the lower tier 423 is erased. Likewise, data may be maintained in the lower tier 423 after upper tier 421 is erased.

Figure 4D:
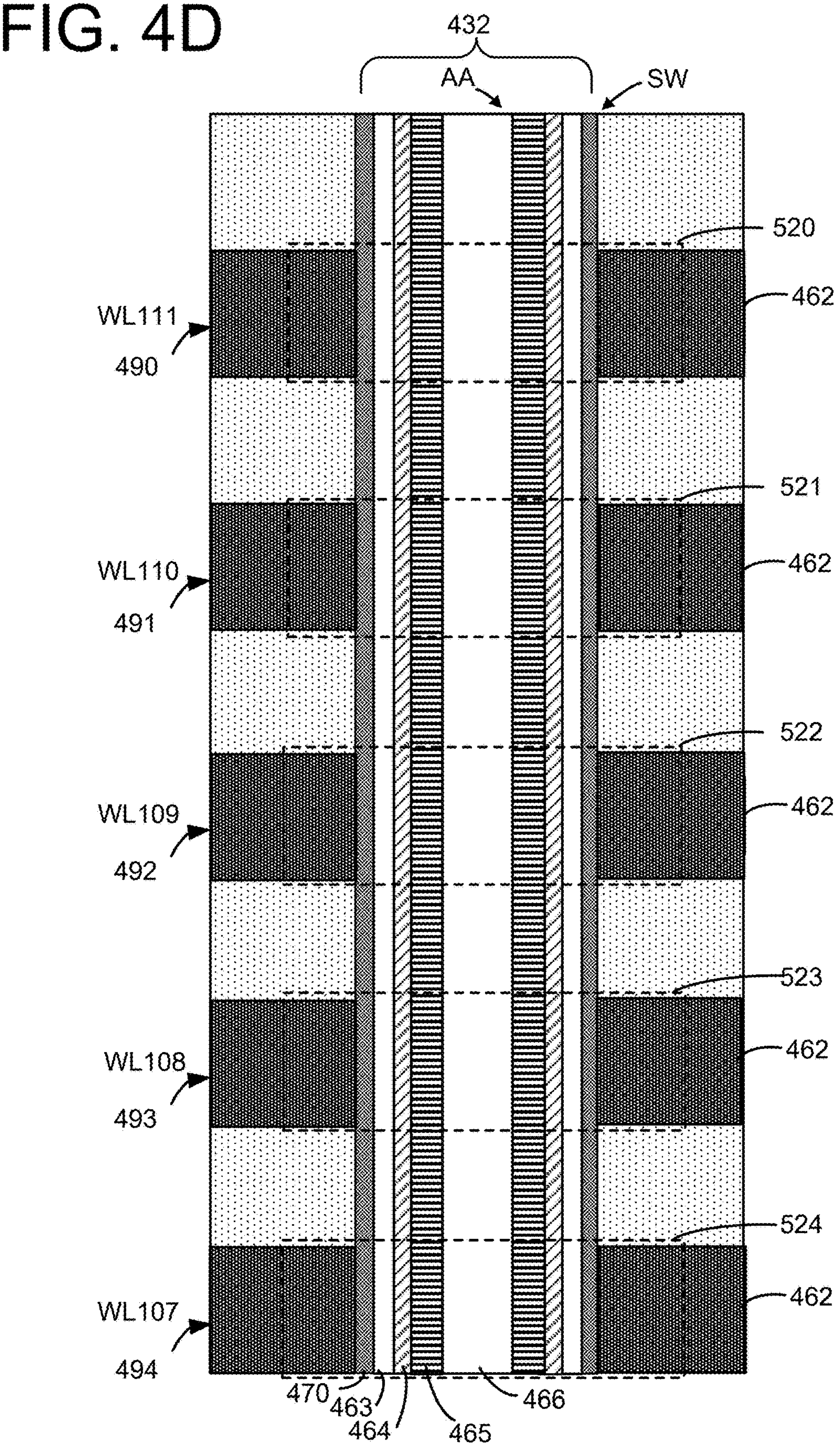
FIG. 4D depicts a view of the region 445 of FIG. 4C.

FIG. 4D depicts a view of the region 445 of FIG. 4C. Data memory cell transistors 520, 521, 522, 523, and 524 are indicated by the dashed lines. A number of layers can be deposited along the sidewall (SW) of the memory hole 432 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vt of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
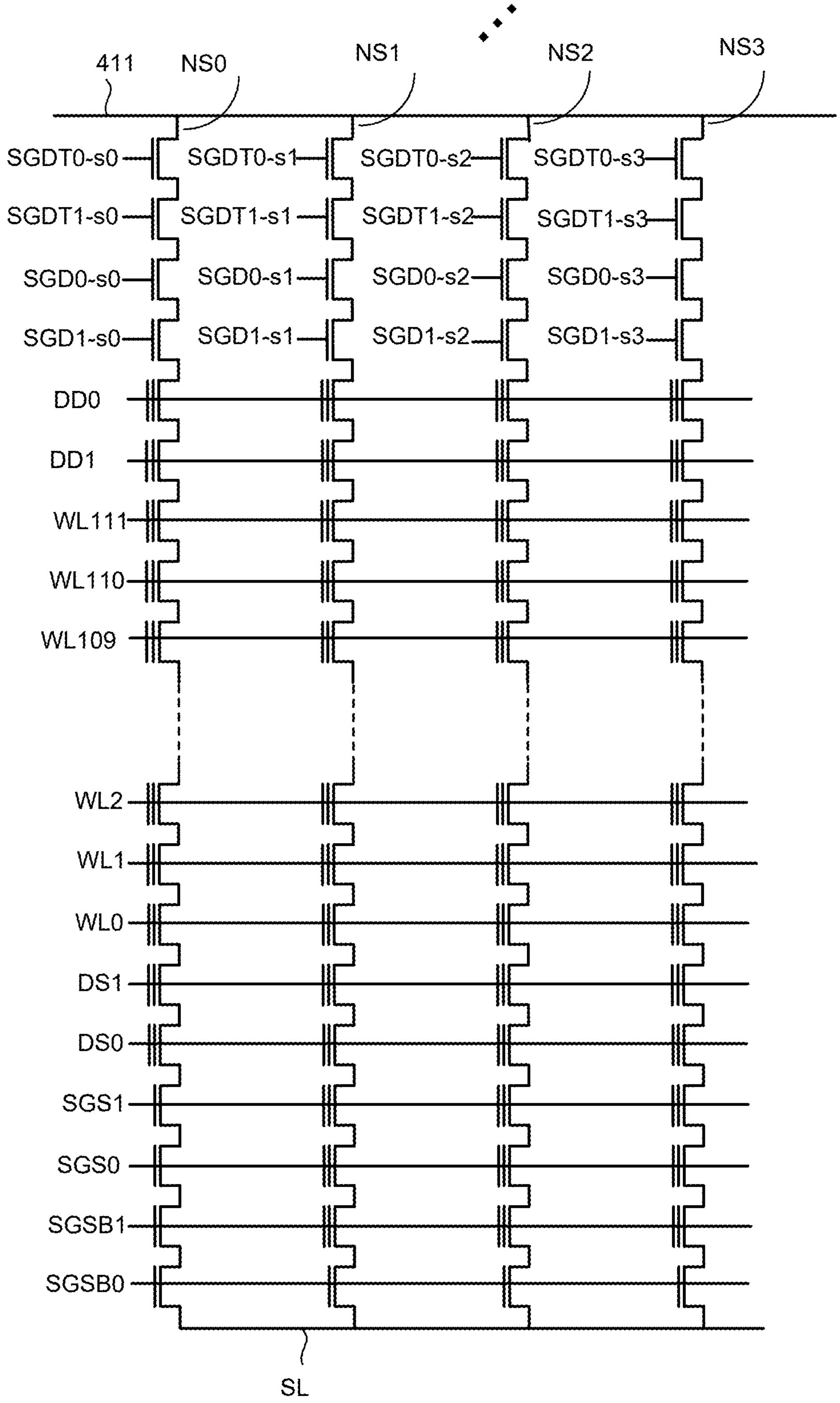
FIG. 4E is a schematic diagram of a portion of one embodiment of a block, depicting several NAND strings.

FIG. 4E is a schematic diagram of a portion of the memory array 202. FIG. 4E shows physical data word lines WL0-WL111 running across the entire block. The structure of FIG. 4E corresponds to a portion 407 in Block 2 of FIG. 4A, including bit line 411. Within the physical block, in one embodiment, each bit line is connected to four NAND strings. Thus, FIG. 4E shows bit line 411 connected to NAND string NS0, NAND string NS1, NAND string NS2, and NAND string NS3.

In one embodiment, there are four sets of drain side select lines in the physical block. For example, the set of drain side select lines connected to NS0 include SGDT0-*s*0, SGDT1-*s*0, SGD0-*s*0, and SGD1-*s*0. The set of drain side select lines connected to NS1 include SGDT0-*s*1, SGDT1-*s*1, SGD0-*s*1, and SGD1-*s*1. The set of drain side select lines connected to NS2 include SGDT0-*s*2, SGDT1-*s*2, SGD0-*s*2, and SGD1-*s*2. The set of drain side select lines connected to NS3 include SGDT0-*s*3, SGDT1-*s*3, SGD0-*s*3, and SGD1-*s*3. Herein the term "SGD" may be used as a general term to refer to any one or more of the lines in a set of drain side select lines. In some embodiments, the same operating voltage is applied to SGDT0 and SGDT1. In some embodiments, the same operating voltage is applied to SGD0 and SGD1. In some erase embodiments, different operating voltage are applied to SGDT0/SGDT1 than to SGD0/SGD1. Note that SGDT0/SGDT1 are adjacent to the bit line. In some erase embodiments, a voltage applied to SGDT0/SGDT1 in combination with a bit line voltage may be used to generate a gate induced gate leakage (GIDL) current. Such a voltage applied to SGDT0/SGDT1 may be referred to herein as a GIDL voltage.

In an embodiment, each line in a given set may be operated independent from the other lines in that set to allow for different voltages to the gates of the four drain side select transistors on the NAND string. Moreover, each set of drain side select lines can be selected independent of the other sets. Each set drain side select lines connects to a group of NAND strings in the block. Only one NAND string of each group is depicted in FIG. 4E. These four sets of drain side select lines correspond to four "sub-blocks." A first sub-block corresponds to those vertical NAND strings controlled by SGDT0-*s*0, SGDT1-*s*0, SGD0-*s*0, and SGD1-*s*0. A second sub-block corresponds to those vertical NAND strings controlled by SGDT0-*s*1, SGDT1-*s*1, SGD0-*s*1, and SGD1-*s*1. A third sub-block corresponds to those vertical NAND strings controlled by SGDT0-*s*2, SGDT1-*s*2, SGD0-*s*2, and SGD1-*s*2. A fourth sub-block corresponds to those vertical NAND strings controlled by SGDT0-*s*3, SGDT1-*s*3, SGD0-*s*3, and SGD1-*s*3. As noted, FIG. 4E only shows the NAND strings connected to bit line 411. However, a full schematic of the block would show every bit line and four vertical NAND strings connected to each bit line.

Although the example memories of FIGS. 4-4E are three dimensional memory structure that includes vertical NAND strings with charge-trapping material, other 3D memory structures can also be used with the technology described herein.

Figure 5A:
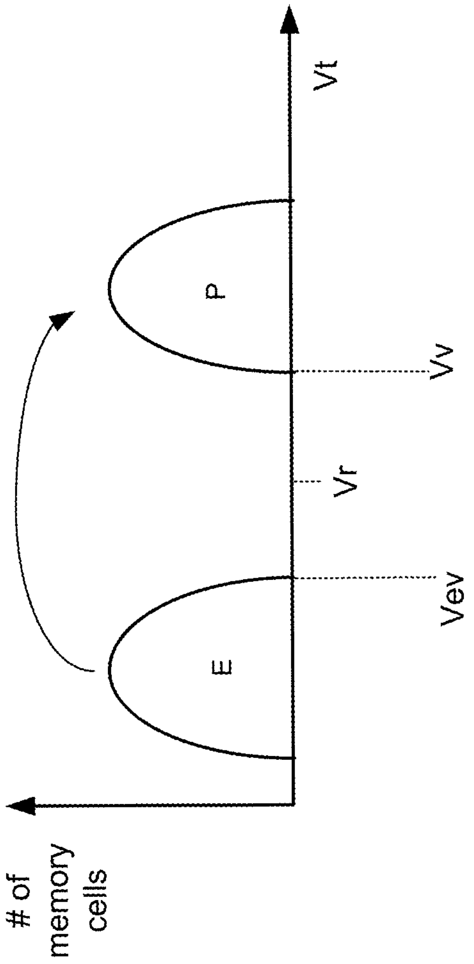
FIGS. 5A, 5B and 5C depict threshold voltage distributions.

The storage systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine whether a memory cell is erased (state E) or programmed (state P). FIG. 5A also depicts verify reference voltage Vv. In some embodiments, when programming memory cells to data state P, the system will test whether those memory cells have a threshold voltage greater than or equal to Vv.

Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores three bits of data. Other embodiments may use other data capacities per memory cell (e.g., such as two, four, or five bits of data per memory cell).

Figure 5B:
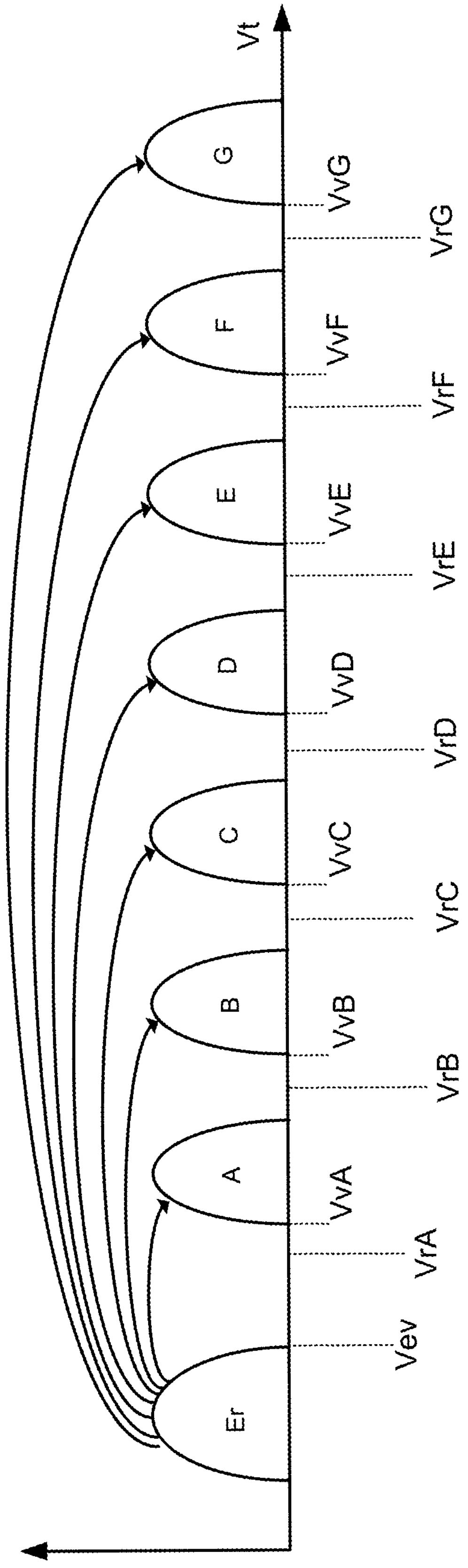

FIG. 5B shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. In an embodiment, the number of memory cells in each state is about the same.

FIG. 5B shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 5B also shows a number of verify reference voltages. The verify reference voltages are VvA, VvB, VvC, VvD, VvE, VvF, and VvG. In some embodiments, when programming memory cells to data state A, the system will test whether those memory cells have a threshold voltage greater than or equal to VvA. If the memory cell has a threshold voltage greater than or equal to VvA, then the memory cell is locked out from further programming. Similar reasoning applies to the other data states.

Figure 5C:
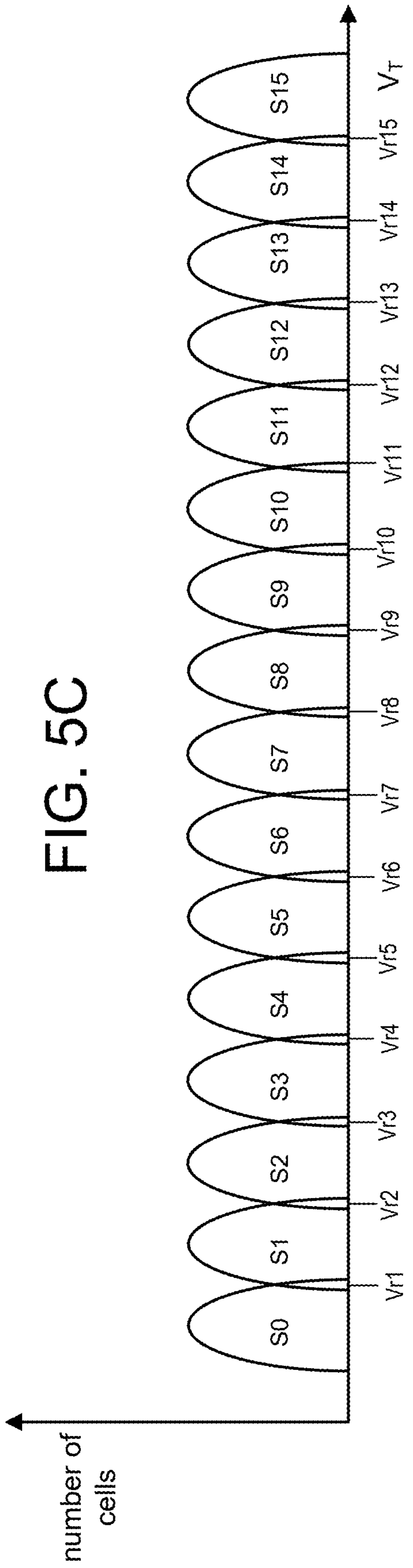

FIG. 5C illustrates example threshold voltage distributions for the memory array when each memory cell stores four bits of data. Other embodiments, however, may use other data capacities per memory cell (e.g., such as one, two, three, or five bits of data per memory cell). FIG. 5C shows 15 read reference voltages, Vr1-Vr15 for reading data from memory cells. The set of memory cells may be connected to the same word line. Each read reference level is used to distinguish between two adjacent threshold voltage distributions. Stated another way, each read reference level is used to distinguish between two adjacent data states. For example, read reference level Vr4 is used to distinguish between data states S3 and S4. Each read reference voltages Vr1-Vr15 used to distinguish between two adjacent threshold voltage distributions may be referred to herein as a "hard bit" reference voltage. By testing (e.g., performing sense operations) whether the threshold voltage of a given memory cell is above or below the 15 read reference voltages, the system can determine what data state (i.e., S0, S1, S2, S3 . . . ) a memory cell is in.

FIG. 5C depicts an example in which four bits are stored per memory cell. Thus, four pages may be stored in a set of memory cells. The set of memory cells may be connected to the same word line. These pages may be referred to as a lower page, lower-middle page, upper-middle page, and upper page. In one embodiment, in order to read the lower page, the memory cells are sensed using four different read reference voltages. For example, the memory cells may be sensed at Vr1, Vr4, Vr6, and Vr11 to read one of the pages.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 5C depicts that there may be some overlap between the data states S0-S15. The overlap may occur due to factors such as memory cells changing charge over time, which is referred to herein as a data retention issue (or more briefly "data retention"). Some states tend to lose charge over time, and therefore may exhibit a drop in Vt over time. However, other states could gain charge over time, and therefor exhibit an increase in Vt over time. For some NAND memory cells there is a neutral Vt, which is a Vt that the memory cell will tend to move towards over time. Memory cells programmed to a Vt above the neutral Vt may tend to see a drop in Vt over time. Memory cells programmed to a Vt below the neutral Vt may tend to see an increase in Vt over time.

Figure 6:
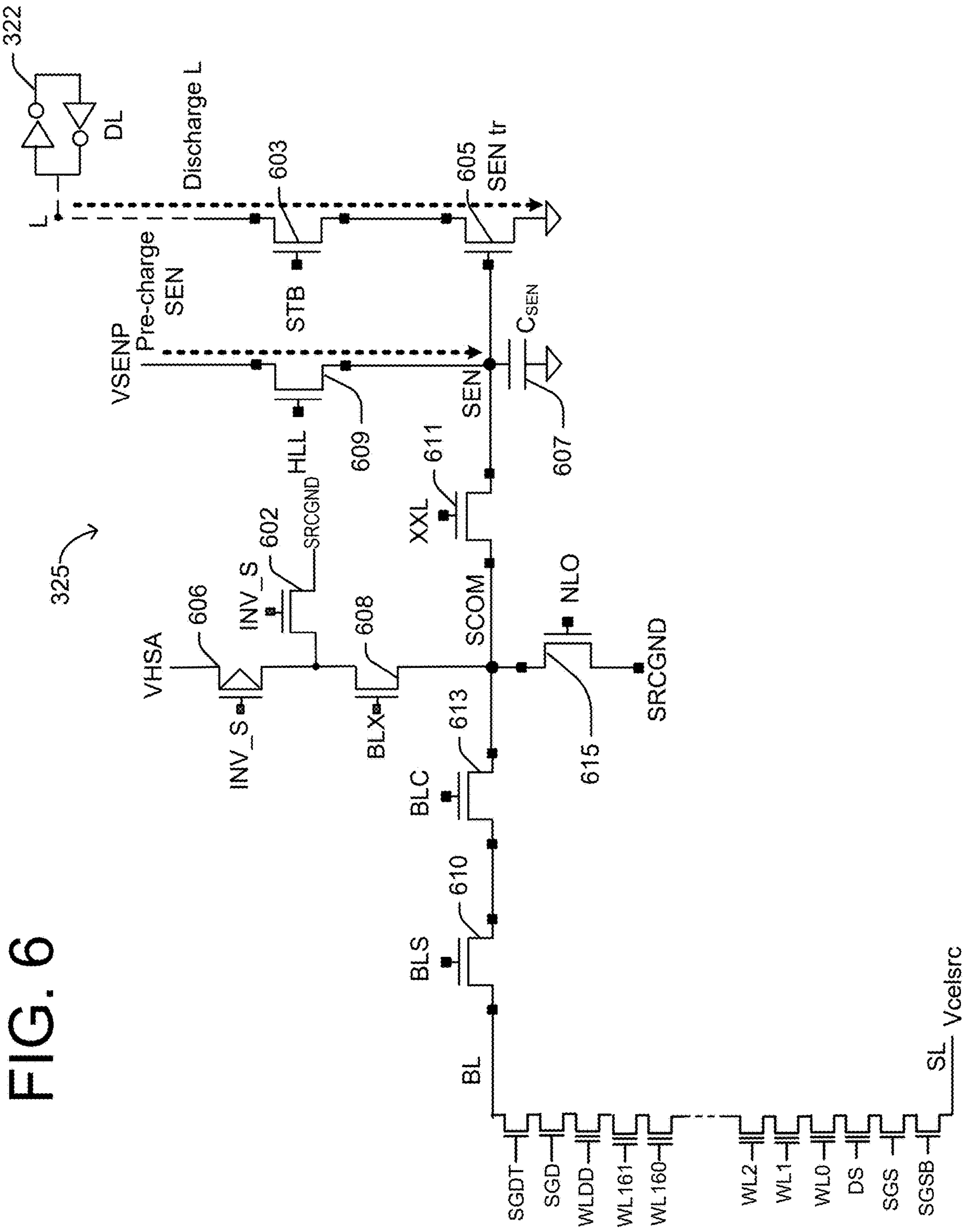
FIG. 6 is a schematic diagram of one embodiment of a sense amplifier.

FIG. 6 is a schematic diagram of one embodiment of a sense amplifier 325. First, basic operation of the sense amplifier 325 when sensing a memory cell will be discussed. The voltage level on the SEN node is set by pre-charging SEN to VSENP through HLL transistor 609, after which it is connected to a selected bit line by way of the transistor XXL 611, transistor BLC 613, and transistor BLS 610. The SCOM node between XXL 611 and BLC 613 can be set to a value, such as ground or pre-charged to a higher level, by way of transistor NLO 615 when XXL 611 and BLC 613 are off. The memory cell current (and hence bit line current) will depend on the memory cell's Vt relative to the reference voltage applied to the control gate of the memory cell. The memory cell current may also depend on Vcelsrc applied to the source line (SL) and the bit line voltage. The bit line current may discharge SEN. Thus, the rate at which SEN is discharged depends on the magnitude of the memory cell current. The amount by which the voltage on SEN is discharged will depend on the length of time the memory cell current discharges SEN. In some embodiments, after charging SEN once there will be multiple successive discharges of SEN. Each discharge of SEN may be achieved by turning on XXL 611 for a period of time referred to as a sense time (also referred to as an integration time).

The sense transistor (SEN tr) 605 is used to test the magnitude of the voltage on SEN. Specifically, a strobe transistor 603 is turned on by STRO to test the magnitude of the voltage on SEN. The latch 322 represents the sense node latch 322 (see FIG. 3C). The value of the latch 322 is determined by the voltage level on the node L, where the node L may be pre-charged to the high VSENP level and then, depending on the voltage level on the SEN node, either discharged or not through the transistor SEN tr 605 during a strobe operation when the transistor STRO 603 is turned on. As noted, the voltage level on the SEN node is pre-charged to VSENP through HLL transistor 609, after which it is connected to a selected bit line. However, in some embodiments, the voltage on SEN will be tested after each of the aforementioned successive sense times. These multiple senses per one charging of SEN allows the memory cell to be tested for multiple different reference voltages with a single charging of SEN.

To hold charge on the SEN node, a sensing capacitor $C_{sen}$ 607 is connected to the SEN node. As illustrated by the broken line arrows, the upper plate of $C_{sen}$ 607 can be pre-charged by way of the pre-charge transistor HLL transistor 609, and then discharged to a selected memory cell along a corresponding bit line by an amount depending on how much current passes through the selected memory cell to set a voltage level on SEN. The level on SEN will then control the amount of current discharged from the node L, and the state latched in DL 322, by way of the sensing transistor SEN tr 605.

FIG. 6 also depicts transistors that may be used to charge the bit line. There are two charging paths for charging the bit line. A first path allows the bit line to be charged to VHSA by a path through transistor 606, BLX transistor 608, BLC transistor 613, and BLS transistor 610. A second path allows the bit line to be charged to SRCGND by a path through transistor 602, BLX transistor 608, BLC transistor 613, and BLS transistor 610. In some embodiments, the bit line is charged to either VHSA or SRCGND during programming. Based on voltages at the control gate and drain of the BLC transistor 613, the transistor can operate as a pass gate or as a bit line clamp. When the voltage at the control gate is sufficiently higher than the voltage on the drain, BLC transistor 613 operates as a pass gate. For example, a program-inhibit voltage such as 2.2 V (e.g., VHSA)) may be passed to the bit line when pre-charging and inhibiting an unselected NAND string. Or, a program-enable voltage such as 0V (e.g., SRCGND) may be passed to the bit line to allow programming in a selected NAND string.

During sensing the BLC transistor 613 may be operated as a source follower to clamp the bit line at a sensing voltage. One condition to operate as a source-follower is for the voltage at the control gate of transistor 613 to be lower than the voltage on the drain. When acting as a source-follower the bit line voltage is set or clamped at Vblc-Vth, where Vblc is the voltage on the control gate and Vth, e.g., 0.7 V, is the threshold voltage of the transistor 613. This assumes the source line (see SL in FIG. 6) is at 0 V. The source line voltage is referred to herein as Vcelsrc. If Vcelsrc is non-zero, the bit line voltage is clamped at Vblc-Vcelsrc-Vth. The transistor 613 is therefore sometimes referred to as a bit line clamp (BLC) transistor, and the voltage Vblc on the control gate may be referred to as a bit line clamp voltage. The source-follower mode can be used during sensing operations such as read and verify operations. To provide Vsense, e.g., 0.8 V, on the bit line, the control gate of BLC transistor 613 may be set to Vsense+Vth, e.g., 1.5 V.

Figure 7:
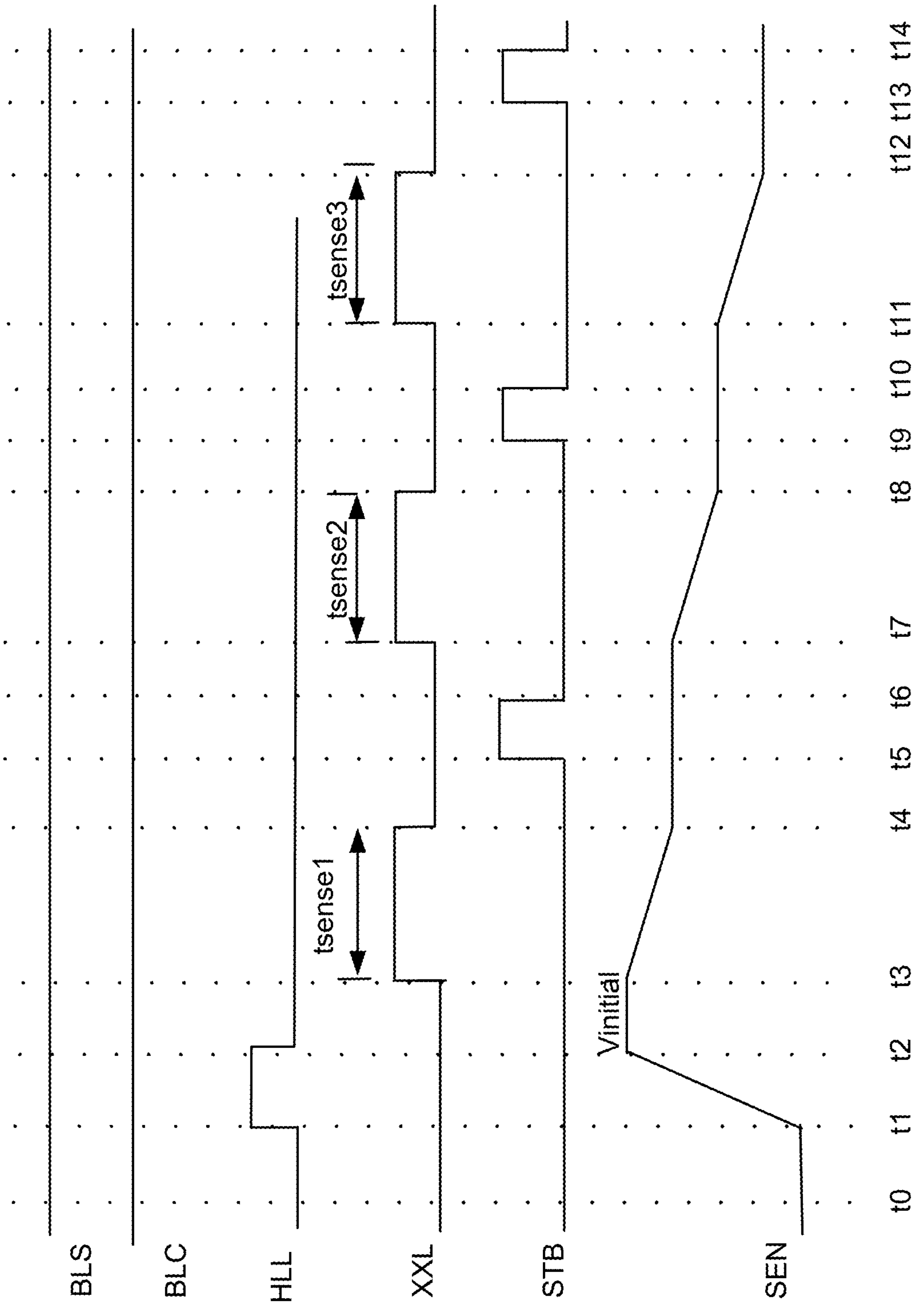
FIG. 7 depicts timing signals in sense amplifier of FIG. 6 in connection with an embodiment of multiple senses of a memory cell with a single charging of SEN.

FIG. 7 depicts timing signals in sense amplifier 325 of FIG. 6 in connection with an embodiment of multiple senses of a memory cell with a single charging of SEN Initially, the sense node SEN may be charged to a sense voltage. Between t1 and t2, HLL is raised high to pre-charge the sense node SEN. As a result, the voltage at SEN is charged to the pre-charge voltage Vinitial. At time t2, HLL goes low, which turns off transistor 609 to stop the pre-charging. Thus, after time t2, a sensing voltage has been established on the SEN node. Also, the word line voltage (not depicted in FIG. 7) has been established at a target reference voltage. The voltage in the selected word line is not depicted in FIG. 7, but may be constant at the same read voltage throughout the sensing depicted in FIG. 7. Also, the source line voltage (not depicted in FIG. 7) has been provided to the source line. Also, the bit line voltage (not depicted in FIG. 7) has been clamped by BLC transistor 613 to a target voltage.

Referring to FIG. 7, at t3, the signal XXL goes high. Also note that BLS and BLC may be high at this time. Referring now to FIG. 6, XXL is provided to the gate of transistor 611, thus turning on transistor 611. Also, transistors 610 and 613 are on at this time. This connects the sense node SEN to the bit line. The capacitor 607 is allowed to discharge its charge through the bit line and NAND string (including the selected memory cell being sensed). The managing circuit will wait for a first sensing time (tsense1). Referring to FIG. 7, the signal XXL remains high from t3 to t4. Also referring to FIG. 7, between t3 and t4, the sense node SEN discharges.

Next, the voltage on the capacitor 607 is tested. Referring to FIG. 7, at t5, the strobe signal STB goes high. Referring to FIG. 6, the sense transistor 605 will be either on or off in response to the voltage on the sense node SEN. With the strobe signal STB high, transistor 603 is on, which provides a current path between the sense transistor 605 and the latch circuit 322. The latch circuit 322 will be set based on whether the sense transistor 605 conducts. Thus, this first sensing has an effective sense time of tsense1.

This sensing process is then repeated two more times without recharging SEN. At t7, the signal XXL goes high. This again connects the sense node SEN to the bit line. The capacitor 607 is allowed to discharge its charge through the bit line and NAND string (including the selected memory cell being sensed). The managing circuit will wait for a second sensing time (tsense2). Referring to FIG. 7, the signal XXL remains high from t7 to t8. Also referring to FIG. 7, between t7 and t8, the sense node SEN discharges. Next, the voltage on the capacitor 607 is tested. Referring to FIG. 7, at t9, the strobe signal STB goes high. Referring to FIG. 6, the sense transistor 605 will be either on or off in response to the voltage on the sense node SEN. With the strobe signal STB high, transistor 603 is on, which provides a current path between the sense transistor 605 and the latch circuit 322. The latch circuit 322 will be set based on whether the sense transistor 605 conducts. Thus, this second sensing has an effective sense time of tsense1+tsense2. This second sensing will test for a different Vt than tested for with the first sensing.

At t11, the signal XXL again goes high. This again connects the sense node SEN to the bit line. The capacitor 607 is allowed to discharge its charge through the bit line and NAND string (including the selected memory cell being sensed). The managing circuit will wait for a third sensing time (tsense3). Referring to FIG. 7, the signal XXL remains high from t11 to t12. Also referring to FIG. 7, between t11 and t12, the sense node SEN discharges. Next, the voltage on the capacitor 607 is tested. Referring to FIG. 7, at t13, the strobe signal STB goes high. Referring to FIG. 6, the sense transistor 605 will be either on or off in response to the voltage on the sense node SEN. With the strobe signal STB high, transistor 603 is on, which provides a current path between the sense transistor 605 and the latch circuit 322. The latch circuit 322 will be set based on whether the sense transistor 605 conducts. Thus, this third sensing has an effective sense time of tsense1+tsense2+tsense3. This third sensing will test for a different Vt than tested for with the first sensing, as well as a different Vt than tested for with the second sensing.

Figure 8:
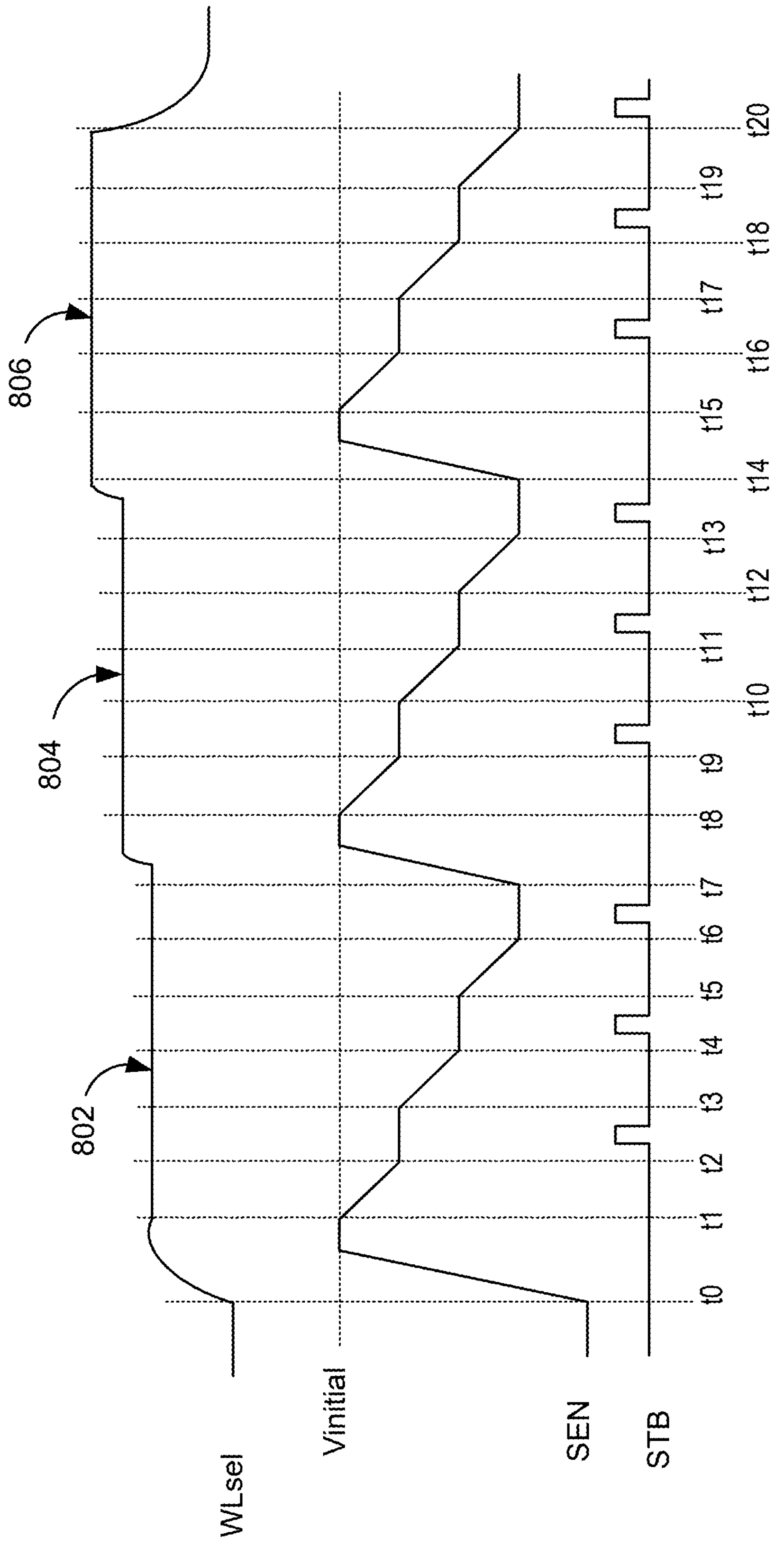
FIG. 8 is timing diagram of signals during an embodiment of a valley scan having multi-sensing per a single charge of a sense node.

FIG. 8 is timing diagram of signals during an embodiment of a valley scan having multi-sensing per a single charge of a sense node. In an embodiment, the circuit of FIG. 6 is used for the valley scan; however, a different sensing circuit could be used for the valley scan. The valley scan looks for a valley between two adjacent Vt distributions. These could be any two adjacent Vt distributions such as, but not limited to, any two adjacent Vt distributions in FIG. 5B or 5C.

FIG. 8 shows that the voltage applied to the selected word line (WLsel) has three levels 802, 804, 806. The voltage on the sense node (SEN) is also depicted, as well as the timing of the strobe signal (STB). The timing of the strobe signal (STB) indicates that nine separate senses are performed. SEN is charged three times, with three sensing per charge. SEN is charged beginning at t0. Also, the voltage on the selected word line is raised to the first sensing level 802 by no later than t1. The relative timing of the raising of voltage on WLsel and SEN can be different than depicted. Between t1 and t2 SEN is discharged by the memory cell current. This discharging may be achieved by connecting SEN to the bit line for the first sensing time. STB is raised high between t2 and t3 to sense the voltage on SEN. Between t3 and t4 SEN is discharged by the memory cell current. STB is raised high between t4 and t5 to sense the voltage on SEN a second time. Thus, the second sensing has the effect of a sensing time of the combined times of the first two sense times. Between t5 and t6 SEN is discharged by the memory cell current. STB is raised high between t6 and t7 to sense the voltage on SEN a third time. Thus, the third sensing has the effect of a sensing time of the combined times of the first three sense times. Therefore, three senses of the memory cell are achieved with a single charging of SEN. Moreover, although the voltage on the selected word line remains the same for these three senses, the different sense times have the effect of testing for three different Vts.

At t7 SEN is charged for a second time. Also, the selected word line voltage is raised to the next level 804 no later than t8. Between t8 and t9 SEN is discharged by the memory cell current. STB is raised high between t9 and t10 to sense the voltage on SEN. Between t10 and t11 SEN is again discharged by the memory cell current. STB is raised high between t1 and t12 to sense the voltage on SEN a second time. Between t12 and t13 SEN is discharged by the memory cell current. STB is raised high between t3 and t14 to sense the voltage on SEN a third time. Therefore, three additional senses of the memory cell are achieved with this second charging of SEN. Moreover, although the voltage on the selected word line remains the same (level 804) for these three senses, the different sense times have the effect of testing for an additional three different Vts.

At t14 SEN is charged for a third time. Also, the selected word line voltage is raised to the next level 804 no later than t15. Between t15 and t16 SEN is discharged by the memory cell current. STB is raised high between t16 and t17 to sense the voltage on SEN. Between t17 and t18 SEN is again discharged by the memory cell current. STB is raised high between t8 and t19 to sense the voltage on SEN a second time. Between t19 and t20 SEN is discharged by the memory cell current. STB is raised high after t20 to sense the voltage on SEN a third time. Therefore, three additional senses of the memory cell are achieved with this second charging of SEN. Moreover, although the voltage on the selected word line remains the same (level 806) for these three senses, the different sense times have the effect of testing for yet an additional three different Vts. Thus, the memory cell is sensed for nine different Vts with three charges of SEN. More generally, more or fewer than three senses may be made for each charging of SEN.

Figure 9:
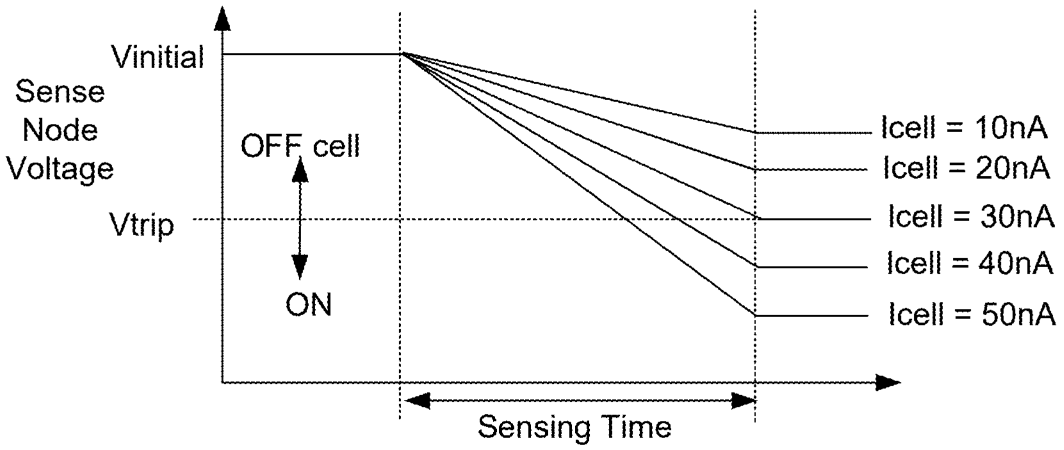
FIG. 9 is a graph of sensing time versus sense node voltage for different memory cell currents.

FIG. 9 is a graph of sensing time versus sense node voltage for different memory cell currents. Five example memory cell currents are depicted (10 nA, 20 nA, 30 nA, 40 nA, and 50 nA). The sense node is initially charged to the voltage of Vinitial. The sensing time refers to the amount of time that the memory cell current discharges the voltage on the sense node. The voltage Vtrip is a sense node voltage level that demarcates between the memory cell being in a first state (OFF) and a second state (ON). In an embodiment, a transistor such as SEN tr 605 (see FIG. 6) will sense the voltage on the sense node. In this example, a memory cell current of at least 30 nA will result in a determination that the memory cell is "ON" and a memory cell current of less than 30 nA will result in a determination that the memory cell is "OFF". Note that this assumes that the sense node is discharged for the sensing time. However, if the sensing time were made longer then even a lower memory cell current such as 20 nA could result in an ON state. On the other hand, if the sensing time were made shorter, then a larger memory cell current such as 40 nA may be needed to result in an ON state.

Figure 10:
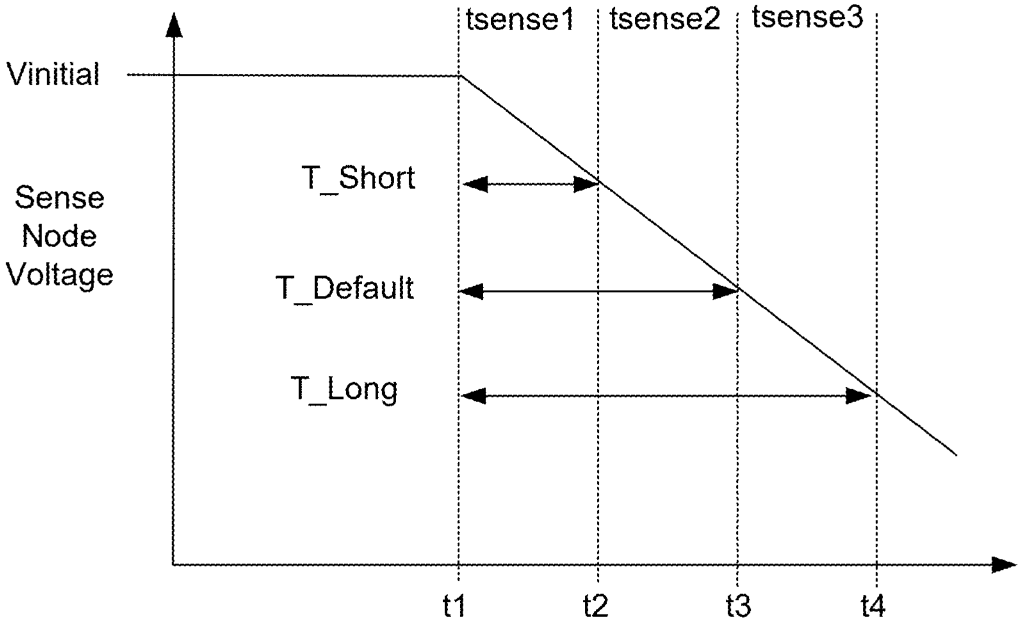
FIG. 10 is a graph of sensing time versus sense node voltage with different sensing times depicted.

FIG. 10 is a graph of sensing time versus sense node voltage with different sensing times depicted. At t1 the sense node is connected to the memory cell to discharge the sense node with the memory cell current. A short sensing time (T_short) is achieved by stopping the discharge of the sense node at t2. A default sensing time (T_default) is achieved by stopping the discharge of the sense node at t3. A long sensing time (T_long) is achieved by stopping the discharge of the sense node at t4. In an embodiment, T_short corresponds to tsense1, T_Default corresponds to tsense1+tsense2, and T_Long corresponds to tsense1+tense2+tsense3 (see also FIG. 7).

Figures 11, 12:
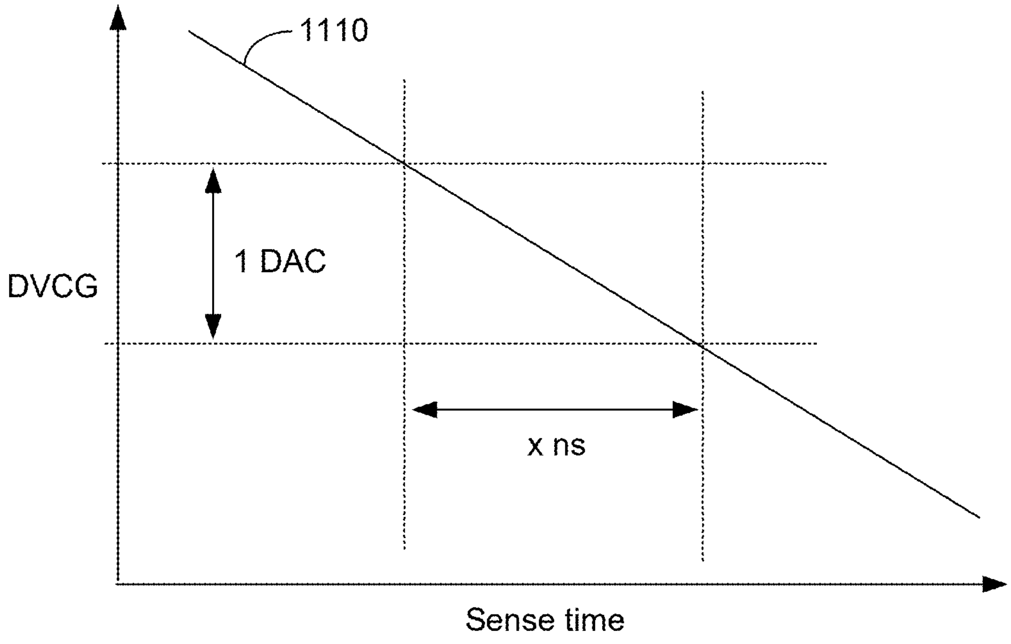
FIG. 11 is a graph depicting a relationship between a reference level (DVCG) and sense time.
FIG. 12 is a table that shows how a relationship between sense time and DAC may be used in an embodiment of a valley scan that has nine reference levels.

FIG. 11 is a graph depicting a relationship between a reference level (DVCG) and sense time. The sense time refers to the amount of time that the memory cell current discharges the sense node. DVCG refers to the voltage applied to the control gate of the memory cell. Plot 1110 shows how a change in sense time can be used to simulate a change in DVCG. Plot 1110 shows a relationship of 1 DAC to x nanoseconds (ns) of sensing time. The DAC refers to a unit of the reference level as y millivolts (mV). For example, 1 DAC could be about 10 to 15 mV (but 1 DAC could be higher or lower than this range). The value of x might be around 100 ns; however, x could be greater or less than 100 ns. Thus, plot 1110 shows how increasing or decreasing the sense time from a default sense time can be used to, in effect, simulate a change in the control gate voltage. For example, using the same control gate voltage with three different sense times can be equivalent to using three different control gate voltages each with the same sense time. Thus, changing the sensing time may be used to test for different Vts, while maintaining the same voltage on the memory cell control gate.

FIG. 12 is a table that shows how a relationship between sense time and DAC may be used in an embodiment of a valley scan that has nine reference levels (with each reference level corresponding to a different Vt to be tested). The stair number column 1202 refers to the nine difference reference levels. The DVCG column 1204 shows the target reference levels with reference to a base level of 0 mv for stair 9. Moving from stair 9 towards stair 1, each stair drops by 1 DAC. For example there may be a 10 mV difference between each stair in the target effective reference level. The DVCG_new column 1206 shows the actual voltage applied to the selected word line for an embodiment of a valley scan. In this example, there are three different voltages applied to the selected word line consistent with the example in FIG. 8. For example, −7 DAC may be used for level 802, −4 DAC may be used for level 804, and −1 DAC may be used for level 806. The DSEN column 1208 shows the sense times of multi-sensing per single sense node charge in a valley scan. For the first stair the sense time is ts1. For the second stair the sense time is ts1+ts2. For the third stair the sense time is ts1+ts2+ts3. In an embodiment, the combined sense time of ts1+ts2 is a nominal (or default) sense time, which may be used to test for a nominal Vt for the read voltage applied to the selected word line. Therefore, the sense time of ts1 represents a decrease with respect to the nominal sense time in order to test for a lower Vt than the nominal Vt. In contrast, the sense time of ts1+ts2+ts3 represents an increase to the nominal sense time in order to test for a higher Vt than the nominal Vt. Similar reasoning applies to stairs 4 to 6 and stairs 7 to 9.

Figure 13:
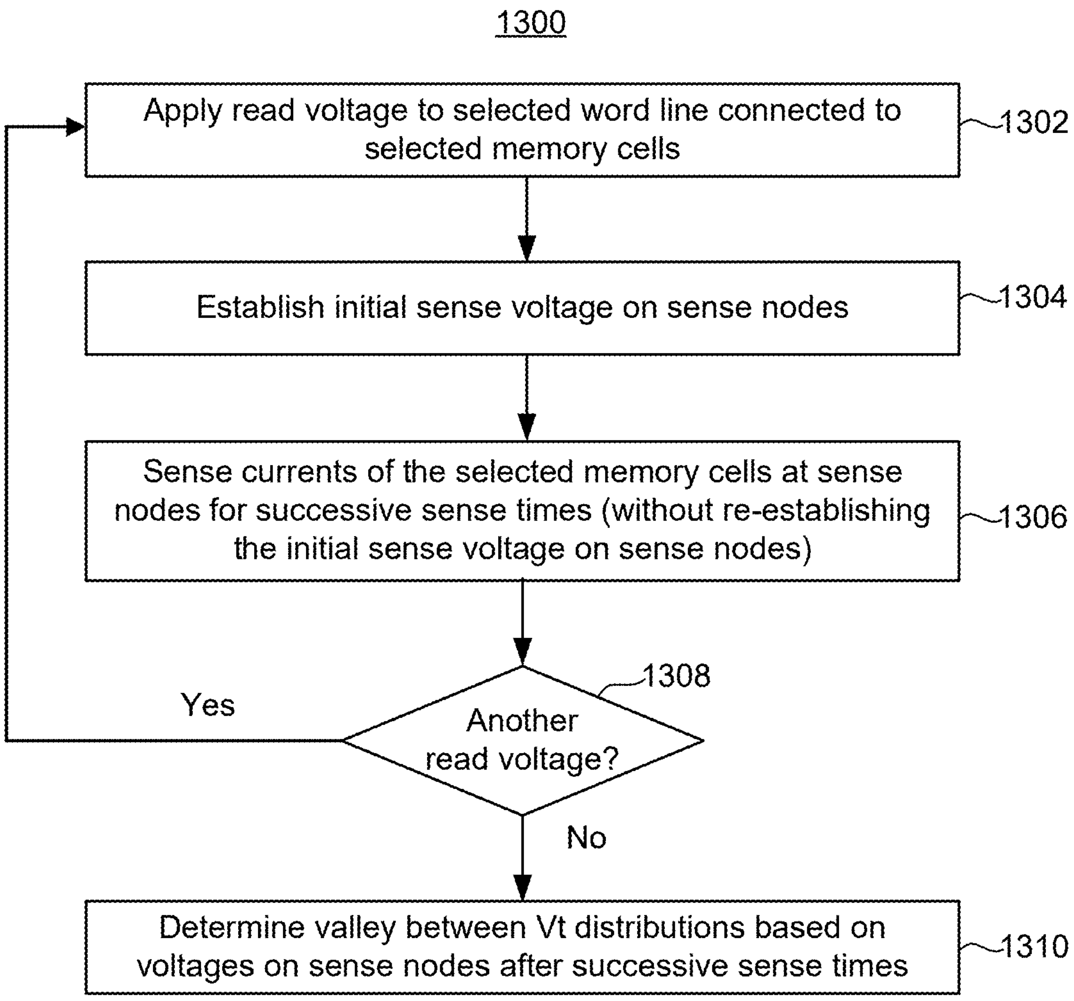
FIG. 13 is a flowchart of an embodiment of a process of performing a valley scan with multiple senses per charging of a sense node.

FIG. 13 is a flowchart of an embodiment of a process 1300 of performing a valley scan with multiple senses per charging of a sense node. The valley scan may be for a set of selected memory cells connected to the selected word line. The selected memory cells may reside on NAND strings. Each selected memory cell may reside on a different NAND string. Each selected memory cell is associated with a bit line and a sense amplifier. Each sense amplifier has a sense node that may be connected to (and disconnected from) the bit line associated with the sense amplifier.

Step 1302 includes applying a read voltage to a selected word line connected to the selected memory cells. For example, read level 802 is applied (see FIG. 8). Step 1304 includes establishing an initial voltage (Vinitial) on the sense nodes in the respective sense amplifiers.

Step 1306 includes sensing currents of the selected memory cells at sense nodes for successive sense times. This sensing occurs without re-establishing the initial sense voltage on the sense nodes. In an embodiment, a sense time is the amount of time for which the memory cell current discharges the sense node. Alternatively, the memory cell current could be used to charge the sense node. Typically, the memory cell current will flow from the bit line to the source line. However, “reverse sensing” in which the memory cell current flows from source line to the bit line is also possible, in which case the memory cell current could charge the sense node. For ease of discussion, the more typical case of discharging the sense node will primarily be discussed. An example of the successive sense times are depicted in FIG. 7 (e.g., tsense1, tsense2, tsense3). Step 1306 may include connecting each sense node to its associated bit line for a first sense time, disconnecting each sense node from its associated bit line, re-connecting each sense node to its associated bit line for a second sense time, disconnecting each sense node from its associated bit line, and re-connecting each sense node to its associated bit line for a third sense time. Moreover, the successive sense times may have gaps of time between them to allow for the sensing of the sense nodes.

Step 1308 is a determination of whether to apply a different read voltage to the selected word line. For example, steps 1302-1306 could be performed again for read levels 804 and then 806 (see FIG. 8).

Step 1310 includes determining a valley between two adjacent Vt distributions based on the voltages on the sense nodes after the successive sense times. As will be discussed in more detail below the valley point may be determined by comparing results from tested Vts that neighbor each other in the valley scan. Step 1310 may include, for each pair of neighboring Vts in the valley scan, determining a count of a number of the selected memory cells having a Vt between two neighboring Vts. These two neighboring Vts define a Vt window. In effect, the valley point may correspond to a Vt window having the fewest memory cells. After determining the valley, the memory system may then determine a new read level for distinguishing between the two adjacent Vt distributions. The new read level may be at or near the valley point. Moreover, the process 1300 may be performed one or more additional time to determine read level(s) for other adjacent Vt distributions. A calibrated read may then be performed using the new read levels.

Figure 14:
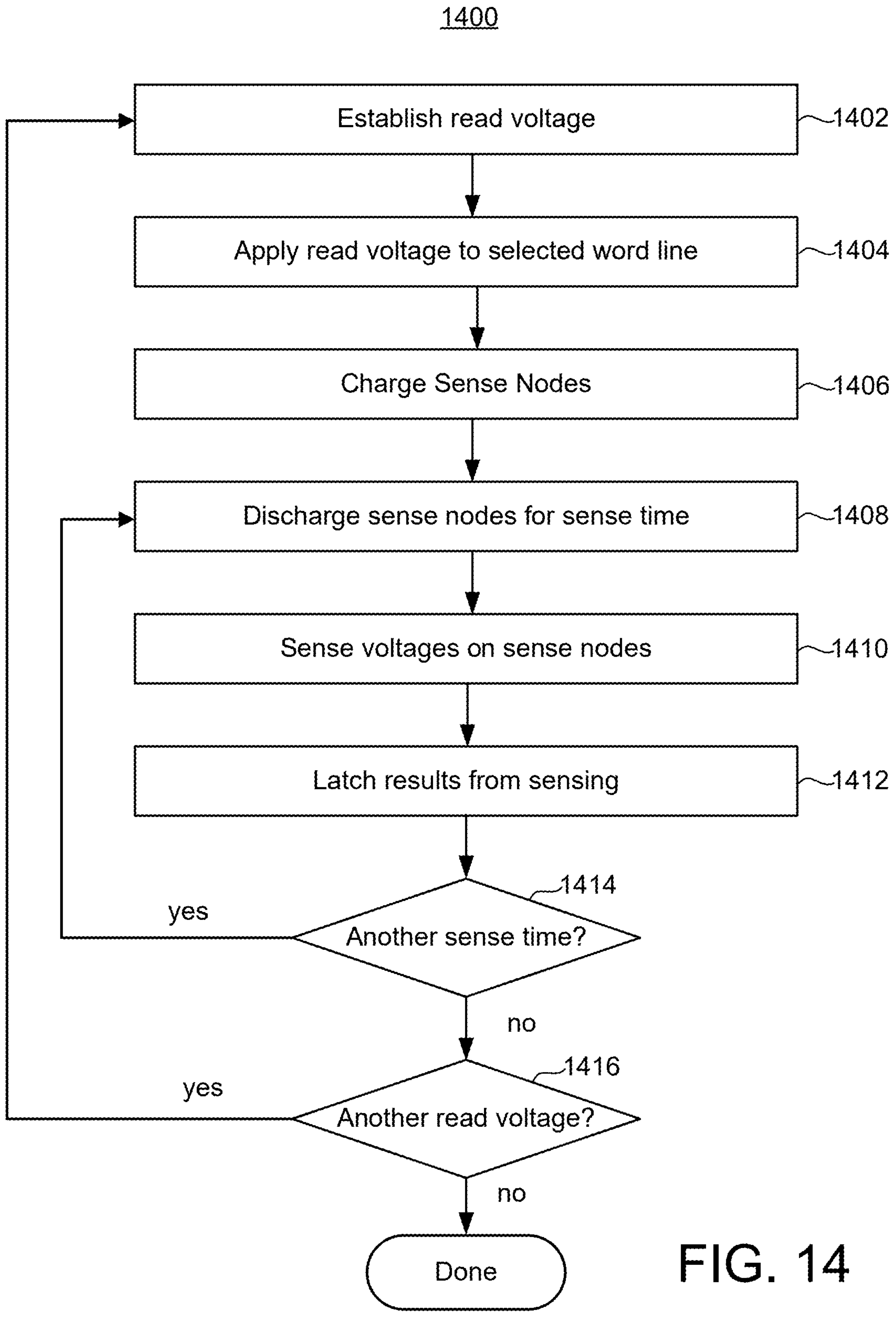
FIG. 14 is a flowchart of an embodiment of a process of performing a valley scan with multiple senses per charging of a sense node.

FIG. 14 is a flowchart of an embodiment of a process 1400 of performing a valley scan with multiple senses per charging of a sense node. Process 1400 process further details of an embodiment of steps 1302-1308 of process 1300. To facilitate discussion of process 1400 an example of a valley scan based on the examples in FIGS. 8 and 10, as well as the circuit of FIG. 6 and associated timing in FIG. 7, will be discussed. However, process 1400 is not limited to these examples.

Step 1402 includes establishing the read voltage. The magnitudes of the read voltages may be established, for example, based on values in the DVCG_New column 1206 in the table in FIG. 12. For example, the first read voltage may be established at level 802 (see FIG. 8), which may correspond to −7 DAC (see FIG. 12). Step 1404 includes applying the read voltage to the selected word line.

Step 1406 includes charging sense nodes. As an example SEN in each of the read/write circuits 325 may be charged. Step 1408 includes dis-charging the sense nodes for a sense time. As an example SEN in each of the read/write circuits 325 may be dis-charged by connecting SEN to the bit line for the sense time. For example, XXL may be brought high (see FIG. 7). Each time that step 1408 is performed corresponds to a test for a different Vt in the valley scan search. Note that a magnitude of a "tested Vt" is based on both the magnitude of the read voltage applied to the selected word line and the sense time. The term "neighbor tested Vt" as used herein means two tested Vts that are next to each other in magnitude in the valley scan.

Step 1410 includes sensing voltages on the sense nodes. For example, the SEN tr 605 may sense the voltage on SEN when STB is bright high. Step 1412 includes latching results from the sensing. For example, the result may be latched in the latch 322.

Step 1414 includes a determination of whether there is another sense time. If so, then the sense nodes are discharged for another sense time. With reference to FIG. 7, there are three successive sense times (tsense1, tsense2, and tsense3). However, there may be more or fewer than three sense times for each read voltage. The table in FIG. 12 has three sense times for each different read voltage. Since this first sensing only has ts1, this may correspond to stair 1. Repeating steps 1408-1412 may have the effect of adding in a second sense time (e.g., tsense2 in FIG. 7). With reference to FIG. 12, the combined ts1+ts2 may test for the Vt associated with stair 2. Repeating steps 1408-1412 again may have the effect of adding in a third sense time (e.g., tsense3 in FIG. 7). With reference to FIG. 10, the combined ts1+ts2+ts3 may test for the Vt associated with stair 3.

When all sense times are performed for this read voltage, step 1416 includes a determination of whether there is another read voltage. If so, then steps 1402-1414 are again performed. As an example, in step 1402 the read voltage may be increased to read level 804 (see FIG. 8). The performance of steps 1408-1412 may be similar that that described above for read level 802. After sensing at all sense times for this read level, steps 1402-1414 may again be performed for any additional read levels (e.g., read level 806 in FIG. 8). When all read levels have been applied to the selected word line the process ends.

Figure 15:
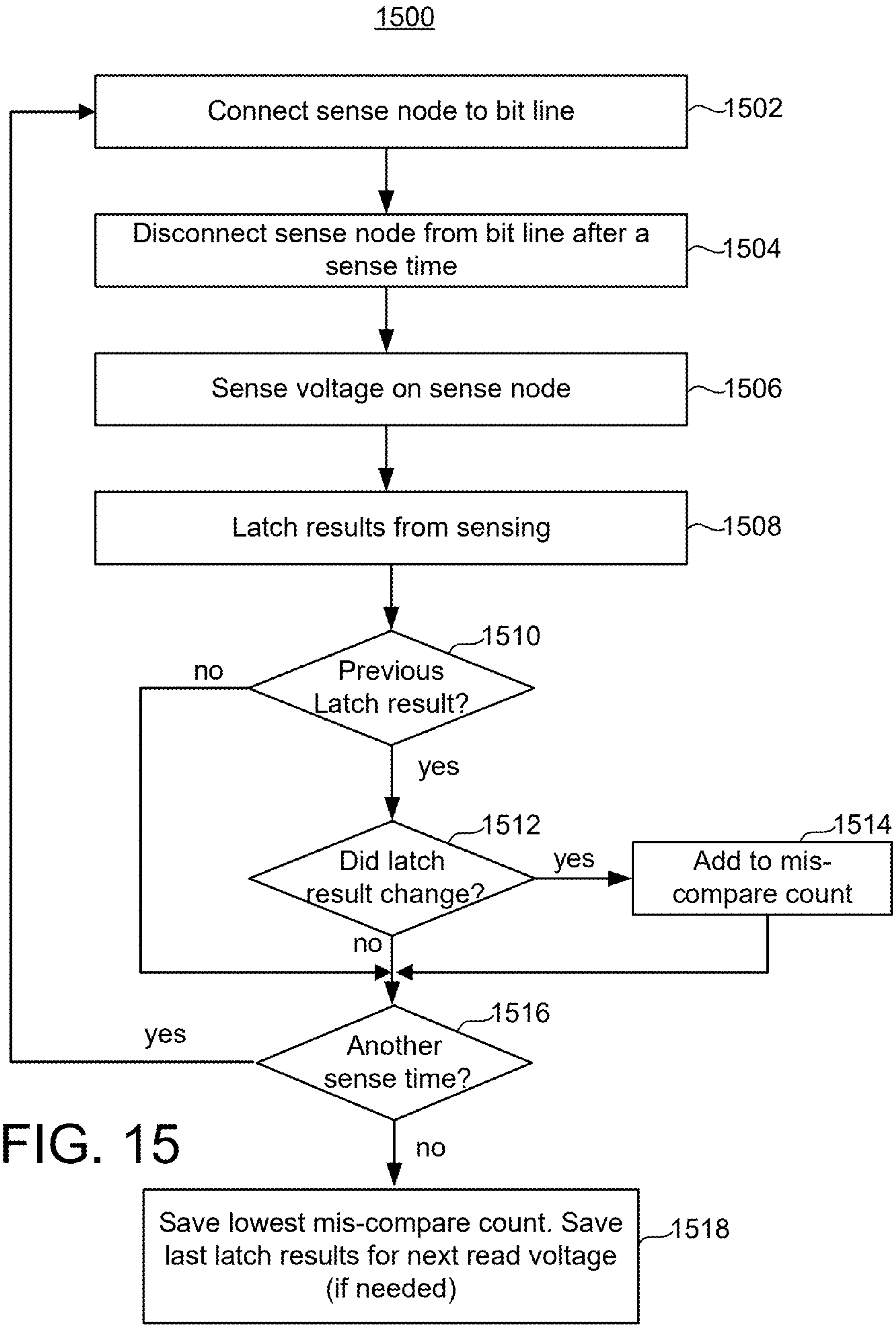
FIG. 15 is a flowchart of an embodiment of a process of performing a valley scan with multiple senses per charging of a sense node.

FIG. 15 is a flowchart of an embodiment of a process 1500 of performing a valley scan with multiple senses per charging of a sense node. Process 1500 process further details of an embodiment of process 1300. Process 1500 process further details of the finding the valley point between two adjacent Vt distributions. For ease of discussion, process 1500 focusses on operating one of the sense amplifiers. Also, process 1500 discusses only the details in connection with applying one of the read voltages to the selected word line.

Step 1502 includes connecting the sense node to the bit line. Step 1504 includes disconnecting the sense node from the bit line after a sense time. For example, the sense node is connected to the bit line for one of tsense1, tsense2 or tsense3. Step 1506 includes sensing the voltage on the sense node. For example, SEN tr 605 senses the voltage on SEN. Step 1508 includes latching the result from sensing. For example, the result is latched in the latch 322. Prior or latching the result in latch 322 the previous result that was stored in latch 322 may be stored in another latch.

Step 1510 is a determination of whether there is a previous latch result from the valley scan. If not then the process continues on at step 1516. However, for the all but the first iteration there should be a result from a previous sensing. In step 1512 a determination is made whether the current result is different from the previous result, which could be referred to as a "mis-compare" or a "bit flip." In an embodiment, the sense node latch 322 changes from "1" to "0". In an embodiment, the sense node latch 322 changes from "0" to "1". Each of these two examples may be referred to as either a "mis-compare" or a "bit flip." Such as mis-compare indicates that the memory cell has a Vt somewhere within a Vt window defined by the Vt tested for in the present sensing and the Vt tested for in the previous sensing. If the result changed, then in step 1514 a mis-compare count is incremented. This mis-compare count will also be incremented for other memory cells having such as mis-compare. This mis-compare count is specifically for the two most recent sense operations. This mis-compare count will be generated for each of the two most recent sense operations as the valley scan proceeds. The mis-compare count is based on tests for two neighbor Vts in the valley scan. The valley scan will look for the lowest mis-compare count in order to find the valley point between the two Vt distributions.

Step 1516 includes a determination of whether there is another sense time for this read level. If so, then then process returns to step 1502. Otherwise, in step 1518 the lowest mis-compare count is saved. Also, the last latch results are saved if there is another read voltage for the valley scan. When all read voltages have been applied the lowest mis-compare count is used to identify the valley point. For example, the two Vts that are tested in connection with the lowest mis-compare count identify the window into which the valley point is located.

In some embodiments, the memory controller 120 establishes parameters of the multi-sense with a single charge of a sense node for a valley scan. As one example, the Open NAND Flash Interface (ONFI) has "set features" commands, which may be used to establish the parameters. In an embodiment, new parameters for multi-sense/single charge valley scan may be specified using "set features" commands. FIG. 16A is a table that may be used to specify how many senses should be performed per a single charge of the sense node during a valley scan. In this example, there could be 1, 2, 3, or 4 senses per single charge of the sense node during a valley scan. Specifying only 1 sense per single charge of the sense node allows for the functionality of multiple senses per a single charge to be disabled. In this example, two bits are used to specify the number of senses, but more bits could be used to allow more than four senses to be specified.

FIG. 16B is a table that may be used to specify the length of the individual sense times. The individual sense times could be specified in a number of ways. As one example, the value of DSEN may be used to specify the length of tsense1, tsense2 and tsense3 (see FIG. 7). For example, if x ns is selected ("01"), then each of tsense1, tsense2 and tsense3 could be x ns, where x is a specific length of time. However, other techniques may be used to specify the length of the sense times. Another example is for the sense time to be specified in terms of a difference from a default sense time. For example, with reference to the example in FIG. 10 the T_default sense time may be a default sense time, with T_short being shorter than T_default by a specified amount (e.g., x ns) and T_long being longer than T_default by the specified amount (e.g., x ns).

In view of the foregoing, an embodiment includes an apparatus comprising a plurality of sense amplifiers and one or more control circuits in communication with the plurality of sense amplifiers. Each sense amplifier has a sense node. The plurality of sense amplifiers are configured to connect to a three-dimensional memory structure having NAND strings, word lines associated with the NAND strings, and bit lines associated with the NAND strings. The one or more control circuits are configured to connect to the three-dimensional memory structure. The one or more control circuits are configured to apply one or more read voltages to a selected word line connected to a set of selected memory cells. The one or more read voltages are associated with two adjacent threshold voltage (Vt) distributions to which the selected memory cells were programmed. The one or more control circuits are configured to, for each of the one or more read voltages applied to the selected word line, sense currents of the selected memory cells at the sense nodes for a plurality of successive sense times for a single charge of each sense node. The one or more control circuits are configured to sense voltages on the sense nodes in response to sensing for each of the sense times for each of the one or more read voltages. Each sensed voltage corresponds to a test for a different Vt of the selected memory cells. The one or more control circuits are configured to determine a valley between the two adjacent Vt distributions based on the sensed voltages on the sense nodes.

In a further embodiment of the apparatus the one or more control circuits are further configured to determine, for each two successive sense times for each of the one or more read voltages, a count of a number of the selected memory cells having a Vt between the two tested Vts that correspond to the two successive sense times. And the one or more control circuits are further configured to determine the valley based on the count having a lowest number of the selected memory cells.

In a further embodiment of the apparatus the one or more control circuits are further configured to latch, for each tested Vt, a set of results. The one or more control circuits are further configured to determine a count, for each two successive tested Vts, of how many of the selected memory cells have a different latch result for the two successive tested Vts. The counts for all of the two successive tested Vts for which the same read voltage was applied to the selected word line are determined with a single charge of the sense nodes. And the one or more control circuits are further configured to determine the valley based on the two successive tested Vts associated with a lowest count.

In a further embodiment of the apparatus sensing the currents of the selected memory cells at the sense nodes for the plurality of successive sense times for the single charge of each sense node comprises the one or more control circuits performing the following for each sense node: charge the sense node to an initial voltage; sense the voltage on the sense node in response to the sense node being connected to an associated bit line for a first sense time while a first read voltage of the one or more read voltages is applied to the selected word line; and sense the voltage on the sense node in response to the sense node being connected to the associated bit line for a second sense time in addition to the first sense time while the first read voltage continues to be applied to the selected word line.

In a further embodiment of the apparatus sensing the currents of the selected memory cells at sense nodes for the plurality of successive sense times for the single charge of each sense node further comprises the one or more control circuits performing the following for each sense node sense the voltage on the sense node in response to the sense node being connected to the associated bit line for a third sense time in addition to both the first sense time and the second sense time while the first read voltage continues to be applied to the selected word line.

In a further embodiment of the apparatus the one or more control circuits are further configured to determine a first number of bit flips between sensing the plurality of sense nodes after the first sense time and sensing the plurality of sense nodes after the second sense time in addition to the first sense time. The bit flips are determined with a single charging of the plurality of sense nodes.

In a further embodiment of the apparatus the one or more control circuits are further configured to divide a valley scan search into a plurality of steps. Each step is associated with one of the Vts to be tested to determine the valley between the two adjacent Vt distributions. And the one or more control circuits are further configured to determine a number of senses to perform for each of the one or more read voltages applied to the selected word line with a single charge of the plurality of sense nodes.

In a further embodiment of the apparatus the one or more control circuits are further configured to determine a magnitude for each of the one or more read voltages based on the Vts to be tested in the valley scan search and the number of senses to perform for each of the one or more read voltages.

In a further embodiment of the apparatus the one or more control circuits are further configured to determine a length of each of the sense times based on the Vts to be tested in the valley scan search and the magnitudes for each of the read voltages.

In a further embodiment the one or more control circuits are further configured to update, based on the valley between the two adjacent Vt distributions, a reference level for distinguishing between the two adjacent Vt distributions.

An embodiment includes a method for performing a valley scan of NAND memory cells. The method comprises: a) applying a read voltage to a selected word line connected to selected NAND memory cells; b) charging each sense node of a plurality of sense nodes to an initial sense voltage; c) discharging the sense nodes with currents of the selected memory cells for a plurality of sense times while applying the read voltage to the selected word line and without re-charging the sense nodes, each sense time of the plurality of sense times being associated with a different tested threshold voltage; d) sensing a voltage on each sense node in response to discharging the sense nodes for each of the sense times to generate a sense result for each tested threshold voltage; e) repeating said a) through said d) for at least one other read voltage applied to the selected word line; and f) determining a minimum number of changes in the result between each pair of neighbor tested threshold voltages.

An embodiment includes a non-volatile storage system, comprising a memory structure having NAND strings, word lines associated with the NAND strings, and plurality of bit lines associated with the NAND strings, each NAND string having memory cells. The non-volatile storage system comprises a plurality of sense amplifiers, each sense amplifier having a sense node, each sense amplifier associated with a bit line of the plurality of bit lines. The non-volatile storage system comprises one or more control circuits in communication with the memory structure and the plurality of sense amplifiers. The one or more control circuits are configured to apply a read voltage to a selected word line connected to selected memory cells. The one or more control circuits are configured to charge the sense nodes in the plurality of sense amplifiers to an initial voltage. The one or more control circuits are configured to discharge the sense nodes with currents of the selected memory cells for a first discharge time while applying the read voltage to the selected word line. The one or more control circuits are configured to sense voltages on the sense nodes that result from discharging the sense nodes for the first discharge time to determine a first set of results for a test for a first threshold voltage. The one or more control circuits are configured to discharge the sense nodes with currents of the selected memory cells for a second discharge time that follows the first discharge time while continuing to apply the read voltage to the selected word line and without again charging the sense nodes. The one or more control circuits are configured to sense voltages on the sense nodes that result from discharging the sense nodes for the second discharge time that follows the first discharge time to determine a second set of results for a test for a second threshold voltage. The one or more control circuits are configured to determine a number of memory cells having a different result in the second set of results than the first set of results.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:

a plurality of sense amplifiers, each sense amplifier having a sense node, the plurality of sense amplifiers configured to connect to a three-dimensional memory structure having NAND strings, word lines associated with the NAND strings, and bit lines associated with the NAND strings; and one or more control circuits in communication with the plurality of sense amplifiers, the one or more control circuits configured to connect to the three-dimensional memory structure, the one or more control circuits configured to:

apply multiple read voltages to a selected word line connected to a set of selected memory cells, the multiple read voltages being associated with two adjacent threshold voltage (Vt) distributions to which the selected memory cells were programmed;

for each of the multiple read voltages applied to the selected word line, sense currents of the selected memory cells at the sense nodes for a plurality of successive sense times for a single charge of each sense node;

sense voltages on the sense nodes in response to sensing for each of the sense times for each of the multiple read voltages, wherein each sensed voltage corresponds to a test for a different Vt of the selected memory cells; and determine a valley between the two adjacent Vt distributions based on the sensed voltages on the sense nodes.

2. The apparatus of claim 1, wherein the one or more control circuits are further configured to:

determine, for each two successive sense times for each of the multiple read voltages, a count of a number of the selected memory cells having a Vt between two tested Vts that correspond to the two successive sense times; and determine the valley based on the count having a lowest number of the selected memory cells.

3. The apparatus of claim 1, wherein the one or more control circuits are further configured:

latch, for each tested Vt, a set of results;

determine a count, for each two successive tested Vts that correspond to two successive sense times, of how many of the selected memory cells have a different latch result for the two successive tested Vts, the counts for all of the two successive tested Vts for which the same read voltage was applied to the selected word line being determined with a single charge of the sense nodes; and determine the valley based on the two successive tested Vts associated with a lowest count.

4. The apparatus of claim 1, wherein sensing the currents of the selected memory cells at the sense nodes for the plurality of successive sense times for the single charge of each sense node comprises the one or more control circuits performing the following for each sense node:

charge the sense node to an initial voltage;

sense the voltage on the sense node in response to the sense node being connected to an associated bit line for a first sense time while a first read voltage of the multiple read voltages is applied to the selected word line; and sense the voltage on the sense node in response to the sense node being connected to the associated bit line for a second sense time in addition to the first sense time while the first read voltage continues to be applied to the selected word line.

5. The apparatus of claim 4, wherein sensing the currents of the selected memory cells at sense nodes for the plurality of successive sense times for the single charge of each sense node further comprises the one or more control circuits performing the following for each sense node:

sense the voltage on the sense node in response to the sense node being connected to the associated bit line for a third sense time in addition to both the first sense time and the second sense time while the first read voltage continues to be applied to the selected word line.

6. The apparatus of claim 4, wherein the one or more control circuits are further configured to:

determine a first number of bit flips between sensing the plurality of sense nodes after the first sense time and sensing the plurality of sense nodes after the second sense time in addition to the first sense time, wherein the bit flips are determined with a single charging of the plurality of sense nodes.

7. The apparatus of claim 1, wherein the one or more control circuits are further configured to:

divide a valley scan search into a plurality of steps, each step associated with one of the Vts to be tested to determine the valley between the two adjacent Vt distributions; and determine a number of senses to perform for each of the multiple read voltages applied to the selected word line with a single charge of the plurality of sense nodes.

8. The apparatus of claim 7, wherein the one or more control circuits are further configured to:

determine a magnitude for each of the multiple read voltages based on the Vts to be tested in the valley scan search and the number of senses to perform for each of the multiple read voltages.

9. The apparatus of claim 8, wherein the one or more control circuits are further configured to:

determine a length of each of the sense times based on the Vts to be tested in the valley scan search and the magnitudes for each of the multiple read voltages.

10. The apparatus of claim 1, wherein the one or more control circuits are further configured to:

update, based on the valley between the two adjacent Vt distributions, a reference level for distinguishing between the two adjacent Vt distributions.

11. A non-volatile storage system, comprising: a memory structure having NAND strings, word lines associated with the NAND strings, and plurality of bit lines associated with the NAND strings, each NAND string having memory cells;

a plurality of sense amplifiers, each sense amplifier having a sense node, each sense amplifier associated with a bit line of the plurality of bit lines; and one or more control circuits in communication with the memory structure and the plurality of sense amplifiers, the one or more control circuits configured to apply multiple read voltages to a selected word line connected to selected memory cells, and for each of the multiple read voltages applied to the selected word line:

charge the sense nodes in the plurality of sense amplifiers to an initial voltage;

discharge the sense nodes with currents of the selected memory cells for a first discharge time while applying the read voltage to the selected word line;

sense voltages on the sense nodes that result from discharging the sense nodes for the first discharge time to determine a first set of results for a test for a first threshold voltage;

discharge the sense nodes with currents of the selected memory cells for a second discharge time that follows the first discharge time while continuing to apply the read voltage to the selected word line and without again charging the sense nodes;

sense voltages on the sense nodes that result from discharging the sense nodes for the second discharge time that follows the first discharge time to determine a second set of results for a test for a second threshold voltage; and determine a number of memory cells having a different result in the second set of results than the first set of results.

12. The non-volatile storage system of claim 11, wherein the one or more control circuits are further configured to:

discharge the sense nodes with currents of the selected memory cells for a third discharge time that follows the second discharge time while continuing to apply the read voltage to the selected word line and without again charging the sense nodes;

sense voltages on the sense nodes that result from discharging the sense nodes for the third discharge time that follows the second discharge time to determine a third set of results for a test for a third threshold voltage; and determine a number of memory cells having a different result in the third set of results than the second set of results.

13. The non-volatile storage system of claim 12, wherein the one or more control circuits are further configured to:

determine a valley between two adjacent Vt distributions based at least in part on the number of memory cells having a different result in sets of results for neighboring tested threshold voltages.

14. The non-volatile storage system of claim 12, wherein the one or more control circuits are further configured to:

divide a valley scan search into a plurality of steps, each step associated with a Vt to be tested;

determine a number of senses to perform for the read voltage; and determine a magnitude the read voltage based on the Vts to be tested in the valley scan search and the number of senses to perform for the read voltage.

15. The non-volatile storage system of claim 11, wherein the one or more control circuits are further configured to:

determine a first length of the first discharge time and a second length of the second discharge time based on a magnitude of the read voltage, the first threshold voltage, and the second threshold voltage.

16. A method comprising:

applying, by one or more control circuits in communication with a plurality of sense amplifiers connected to a three-dimensional memory structure having NAND strings, word lines associated with the NAND strings, and bit lines associated with the NAND strings, multiple read voltages to a selected word line connected to a set of selected memory cells, the multiple read voltages being associated with two adjacent threshold voltage (Vt) distributions to which the selected memory cells were programmed, each sense amplifier having a sense node;

for each of the multiple read voltages applied to the selected word line, sensing currents of the selected memory cells at the sense nodes for a plurality of successive sense times for a single charge of each sense node;

sensing voltages on the sense nodes in response to sensing for each of the sense times for each of the multiple read voltages, wherein each sensed voltage corresponds to a test for a different Vt of the selected memory cells; and determining a valley between the two adjacent Vt distributions based on the sensed voltages on the sense nodes.

* * * * *